United States Patent
Chiu et al.

(10) Patent No.: US 12,293,940 B2
(45) Date of Patent: May 6, 2025

(54) TECHNIQUES FOR FORMING A DEEP TRENCH ISOLATION STRUCTURE BETWEEN PHOTODIODES BY FORMING A FIRST SET OF TRENCHES BASED ON A FIRST PATTERN AND FORMING A SECOND SET OF TRENCHES BASED ON A SECOND PATTERN

(71) Applicant: Taiwan Semiconductor Manufacturing Company, Ltd., Hsinchu (TW)

(72) Inventors: Wei-Chao Chiu, Hsinchu (TW); Yu-Wen Chen, Hsinchu (TW); Yong-Jin Liou, Hsinchu (TW); Chun-Wei Chang, Tainan (TW); Ching-Sen Kuo, Taipei (TW); Feng-Jia Shiu, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/447,547

(22) Filed: Aug. 10, 2023

(65) Prior Publication Data
US 2023/0402315 A1    Dec. 14, 2023

Related U.S. Application Data

(62) Division of application No. 17/303,524, filed on Jun. 1, 2021.

(60) Provisional application No. 63/200,387, filed on Mar. 4, 2021.

(51) Int. Cl.
| | | |
|---|---|---|
| H01L 21/762 | (2006.01) | |
| H01L 21/3065 | (2006.01) | |
| H01L 27/146 | (2006.01) | |

(52) U.S. Cl.
CPC .... *H01L 21/76224* (2013.01); *H01L 21/3065* (2013.01); *H01L 27/14643* (2013.01); *H01L 27/14689* (2013.01)

(58) Field of Classification Search
CPC .......... H01L 21/3065; H01L 21/76224; H01L 27/14634; H01L 27/14689
See application file for complete search history.

(56) References Cited

U.S. PATENT DOCUMENTS

| | | |
|---|---|---|
| 7,611,962 B2 | 11/2009 | Kwak |
| 9,219,092 B2 | 12/2015 | Jangjian et al. |
| 10,546,889 B2 | 1/2020 | Chiu et al. |

(Continued)

FOREIGN PATENT DOCUMENTS

TW    I644419 B    12/2018

*Primary Examiner* — Anh D Mai
(74) *Attorney, Agent, or Firm* — Harrity & Harrity, LLP

(57) ABSTRACT

Double patterning techniques described herein may reduce corner rounding, etch loading, and/or other defects that might otherwise arise during formation of a deep trench isolation (DTI) structure in a pixel array. The double patterning techniques include forming a first set of trenches in a first direction and forming a second set of trenches in a second direction in a plurality of patterning operations such that minimal to no etch loading and/or corner rounding is present at and/or near the intersections of the first set of trenches and the second set of trenches.

20 Claims, 39 Drawing Sheets

(56) References Cited

U.S. PATENT DOCUMENTS

| | | | |
|---|---|---|---|
| 2003/0211702 A1 | 11/2003 | Parat et al. | |
| 2011/0076832 A1* | 3/2011 | Huang | H01L 21/76232 |
| | | | 257/E21.546 |
| 2013/0209936 A1* | 8/2013 | Hatakeyama | G03F 7/2041 |
| | | | 430/285.1 |
| 2014/0272726 A1 | 9/2014 | Chang | |
| 2016/0240387 A1* | 8/2016 | Yen | H01L 21/31116 |
| 2017/0338258 A1 | 11/2017 | Kim et al. | |
| 2019/0279874 A9 | 9/2019 | Lupo | |
| 2020/0119072 A1* | 4/2020 | Lim | G02B 1/14 |
| 2020/0144316 A1 | 5/2020 | Kim et al. | |
| 2020/0279877 A1* | 9/2020 | Kim | H01L 27/1464 |
| 2021/0193705 A1 | 6/2021 | Chiu et al. | |
| 2021/0202547 A1 | 7/2021 | Cho et al. | |
| 2022/0285155 A1 | 9/2022 | Chiu et al. | |
| 2022/0285203 A1 | 9/2022 | Chiu et al. | |

* cited by examiner

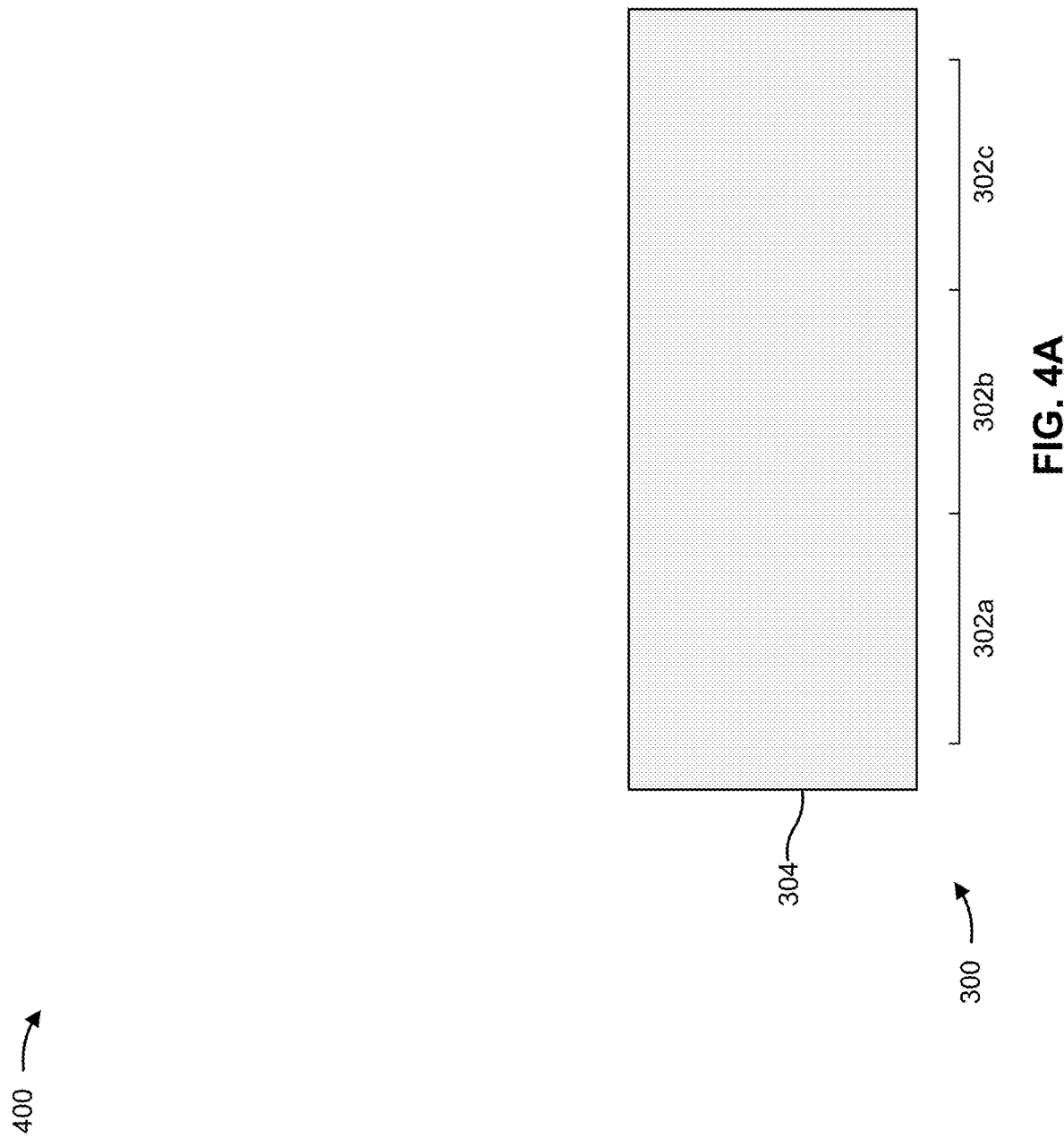

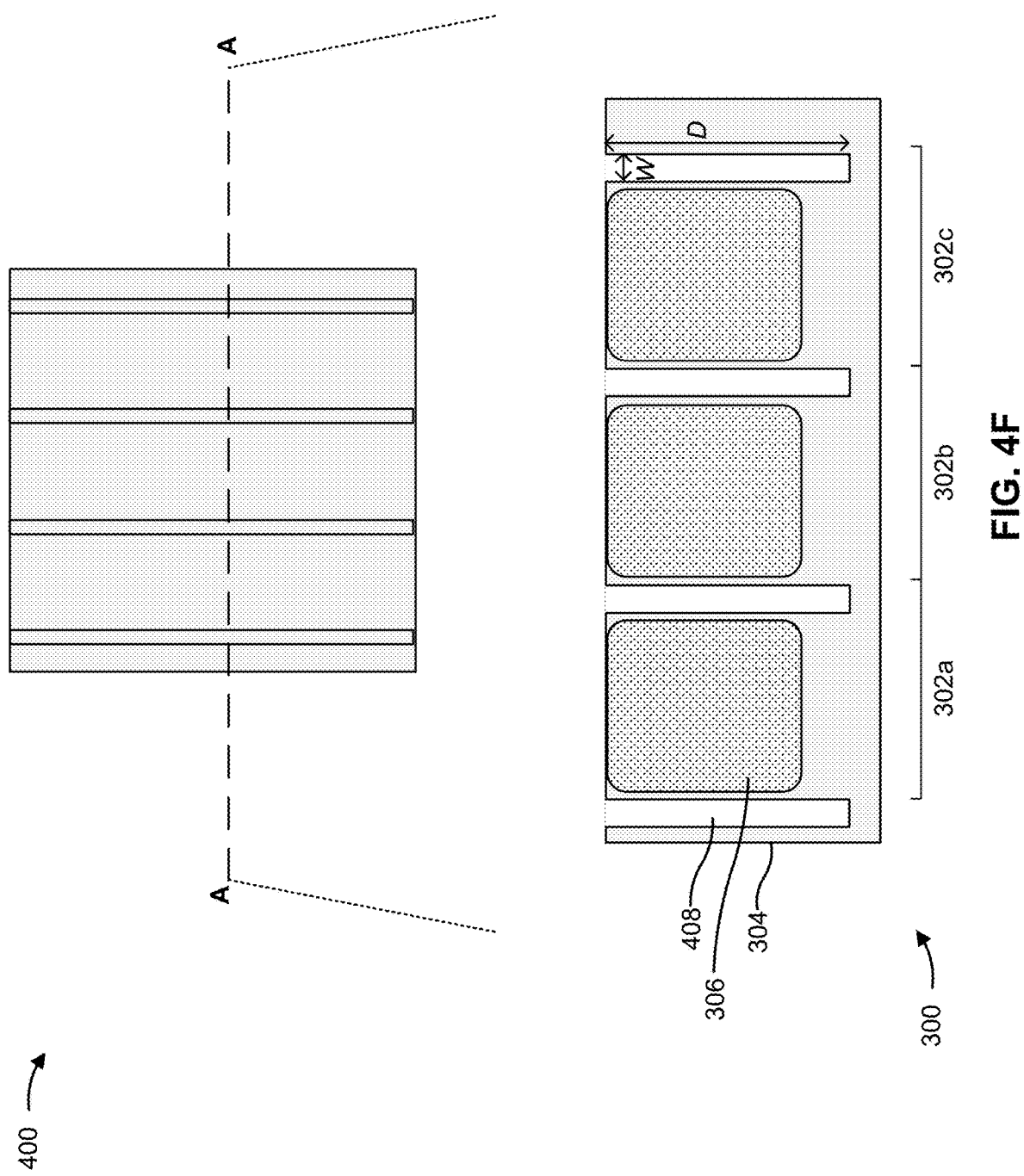

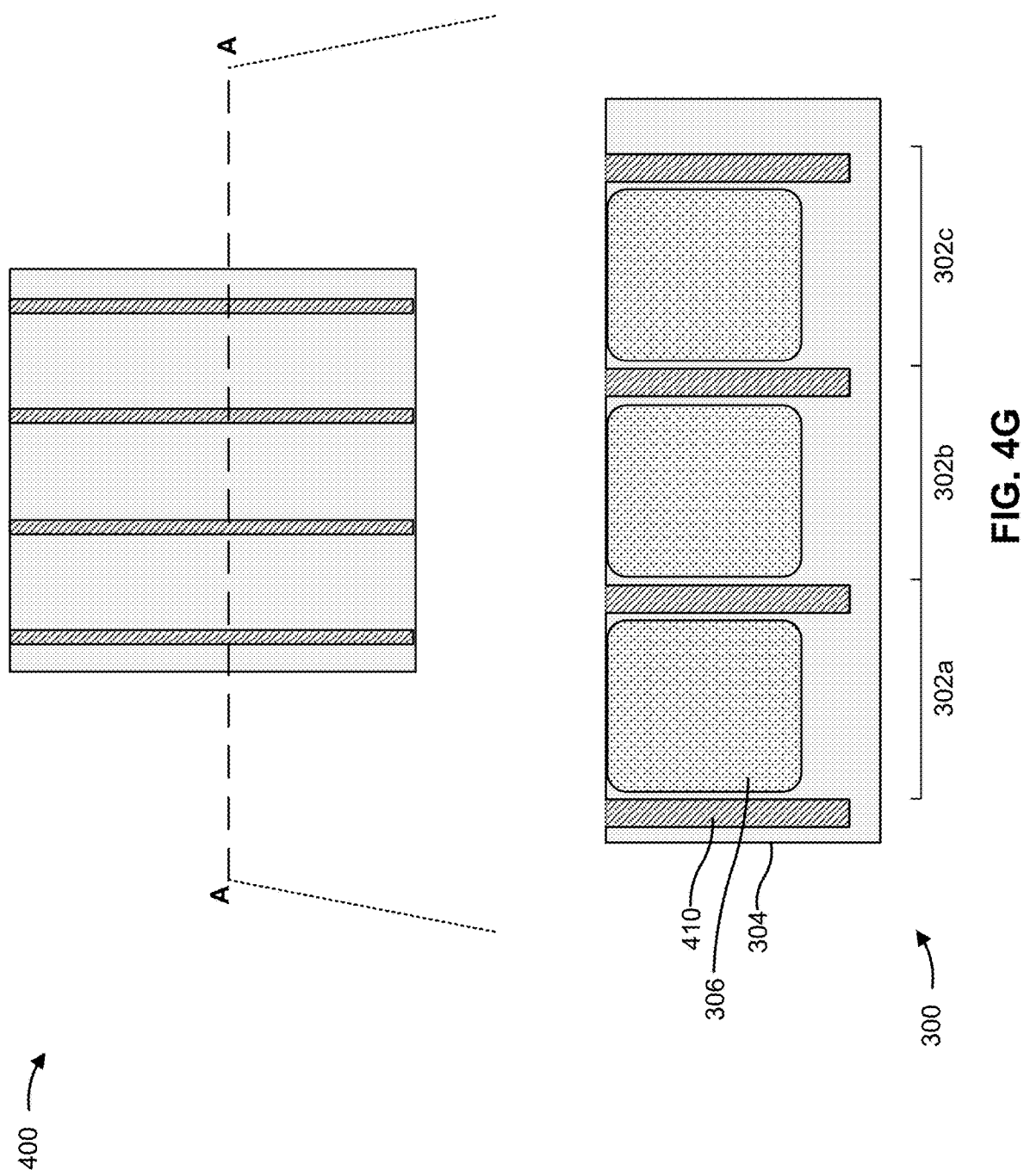

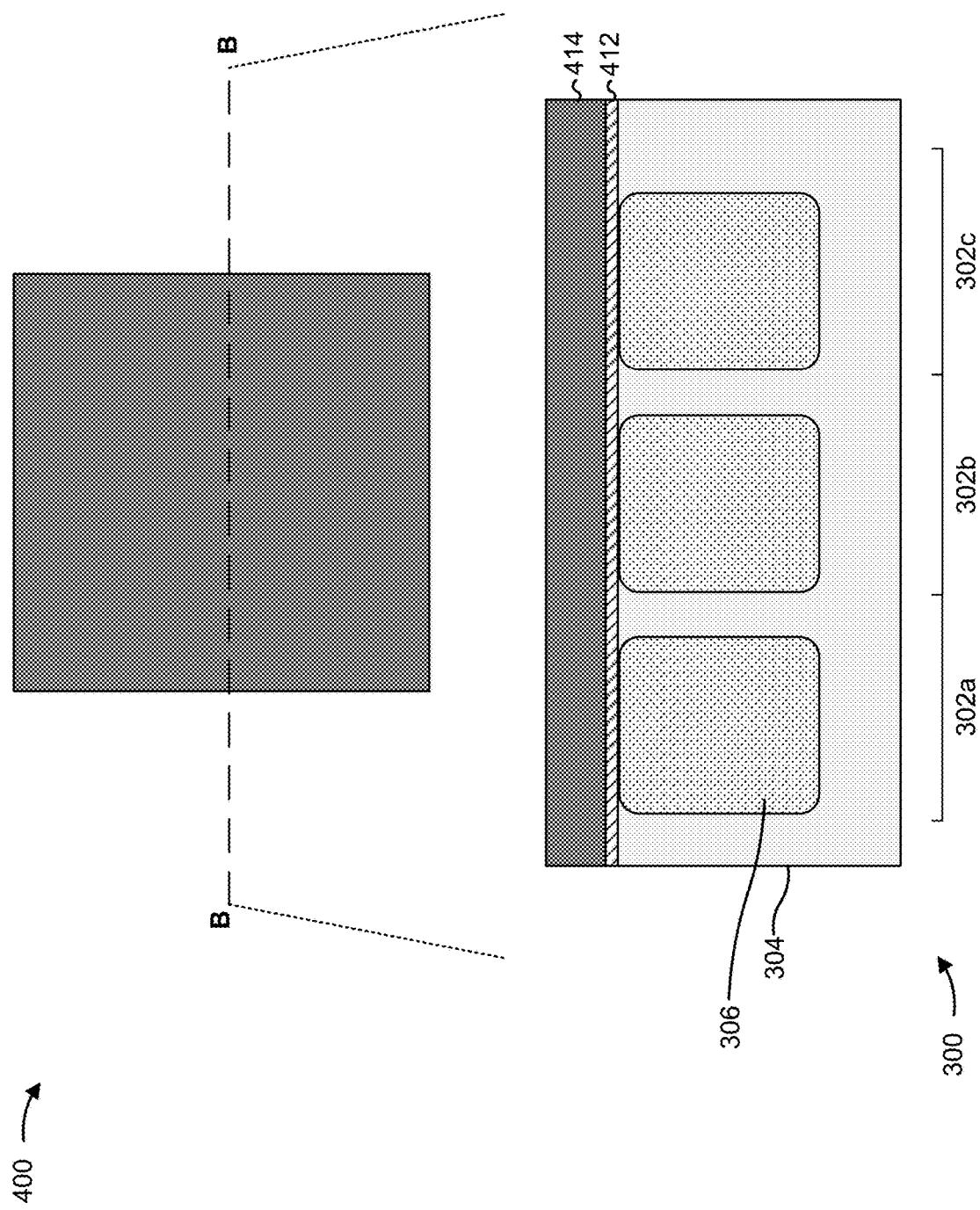

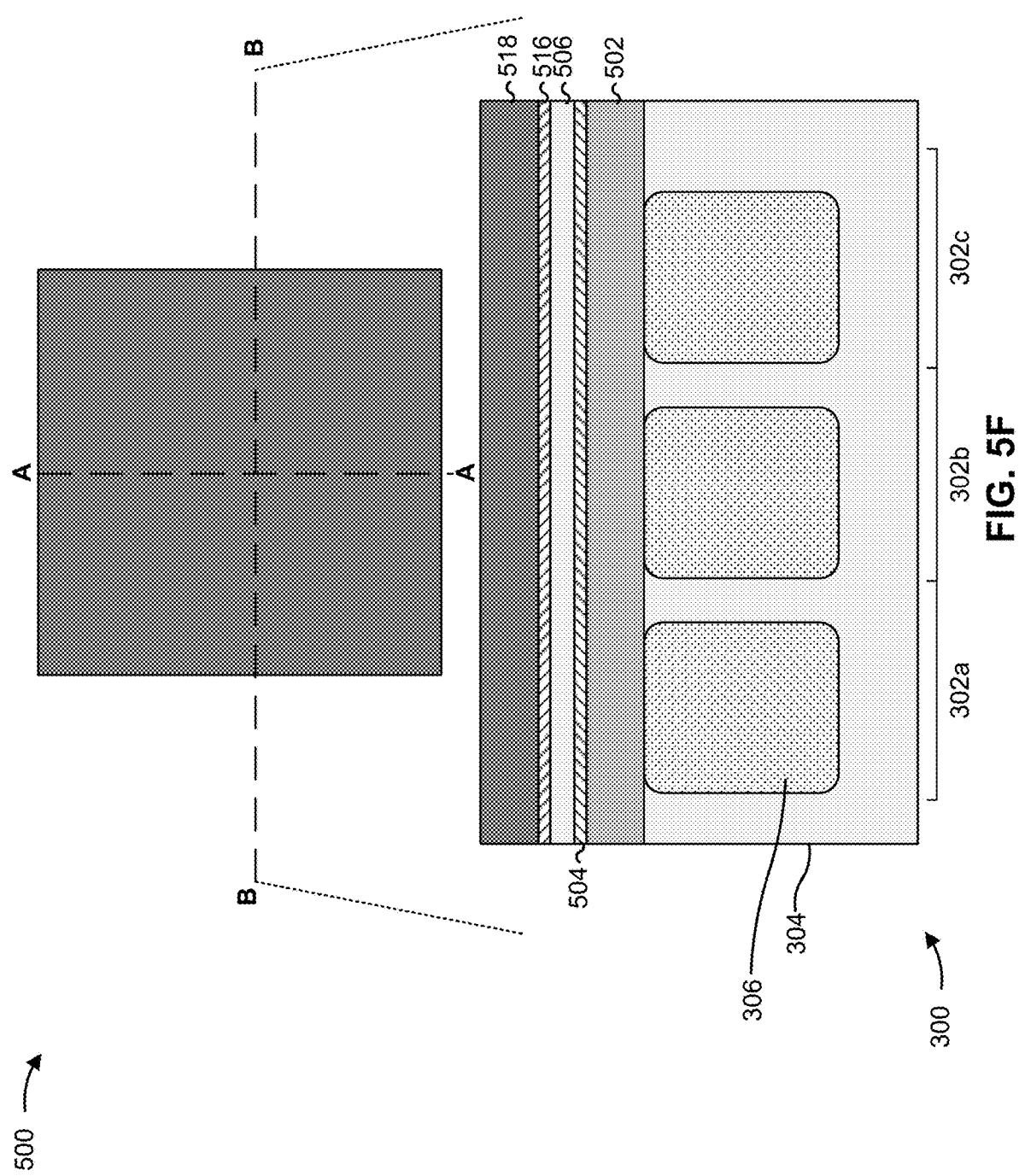

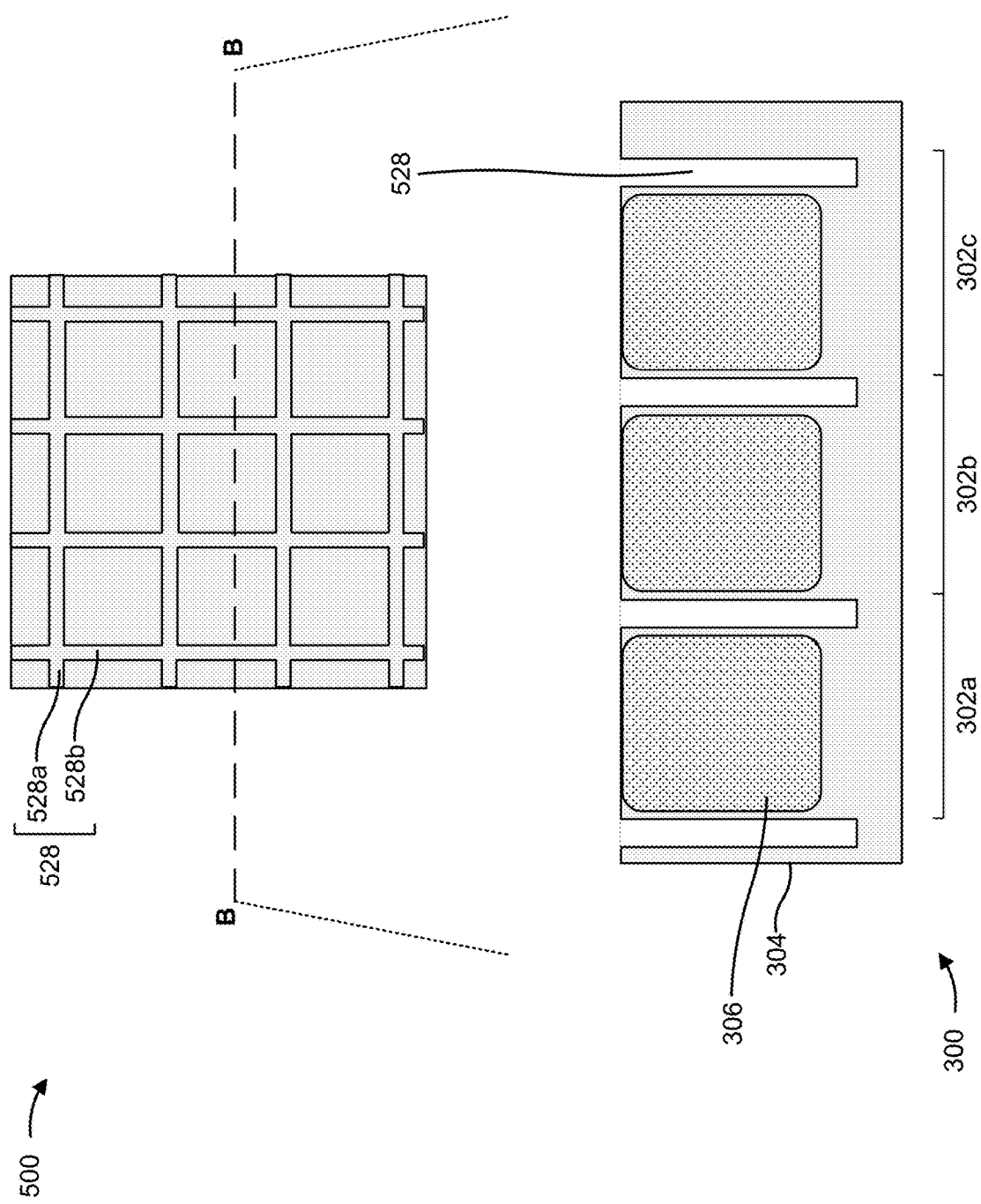

TECHNIQUES FOR FORMING A DEEP TRENCH ISOLATION STRUCTURE BETWEEN PHOTODIODES BY FORMING A FIRST SET OF TRENCHES BASED ON A FIRST PATTERN AND FORMING A SECOND SET OF TRENCHES BASED ON A SECOND PATTERN

CROSS-REFERENCE TO RELATED APPLICATIONS

This application is a divisional of U.S. patent application Ser. No. 17/303,524, filed Jun. 1, 2021, which claims priority to U.S. Provisional Patent Application No. 63/200,387, filed on Mar. 4, 2021, and entitled "DOUBLE PATTERNING TECHNIQUES FOR FORMING A DEEP TRENCH ISOLATION STRUCTURE." the contents of which are incorporated herein by reference in their entireties.

BACKGROUND

Digital cameras and other optical imaging devices employ image sensors. Image sensors convert optical images to digital data that may be represented as digital images. An image sensor includes an array of pixel sensors and supporting logic. The pixel sensors of the array are unit devices for measuring incident light, and the supporting logic facilitates readout of the measurements. One type of image sensor commonly used in optical imaging devices is a backside illumination (BSI) image sensor. BSI image sensor fabrication can be integrated into semiconductor processes for low cost, small size, and high integration. Further, BSI image sensors may have low operating voltage, low power consumption, high quantum efficiency, and low read-out noise, and may allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
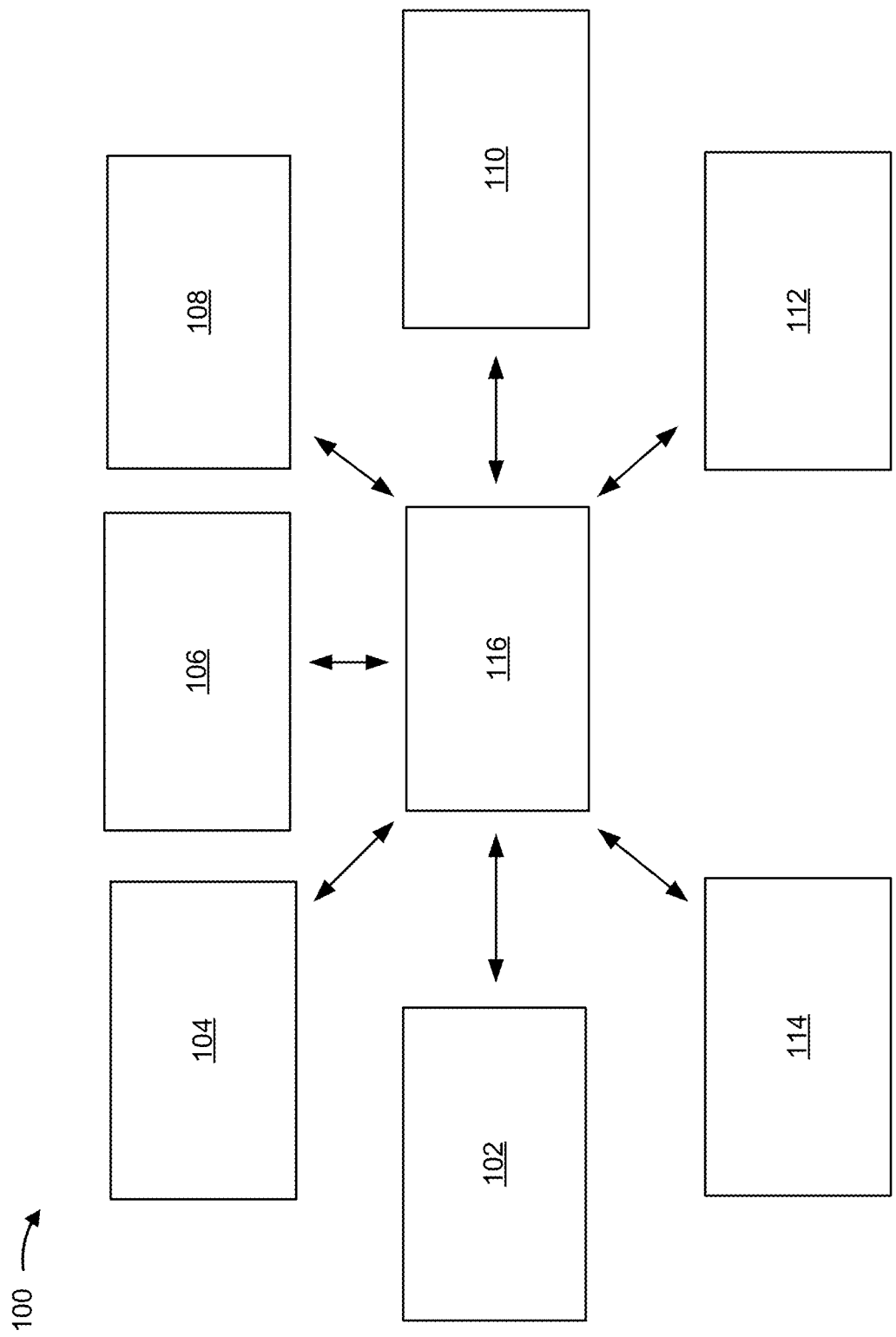
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Backside deep trench isolation (BDTI) structures are used to provide electrical and optical isolation between photodiodes of adjacent pixel sensors in a pixel array. Some issues may arise during formation of a BDTI structure, such as corner rounding and etch loading near the intersections of the trenches of the BDTI structure (e.g., because etching may occur faster in larger openings such as near corners or the intersections). These issues can worsen as pixel sensor sizes continue to shrink, and can reduce the electrical and optical isolation performance of the BDTI structure and/or can reduce the effective pixel sensor area of the pixel sensors.

Some implementations described herein provide double patterning techniques to reduce corner rounding, etch loading, and/or other defects that might otherwise arise during formation of a BDTI structure in a pixel array. The double patterning techniques include forming a first set of trenches in a first direction and forming a second set of trenches in a second direction such that minimal to no etch loading and/or corner rounding is present at and/or near the intersections of the first set of trenches and the second set of trenches.

In some implementations, a double patterning technique includes forming a first pattern in a first photoresist layer on a substrate and performing a first etch operation to form a first set of trenches based on the first pattern. The first photoresist layer may be removed from the substrate, and a second pattern is subsequently formed in a second photoresist layer on the substrate. A second etch operation is performed to form the second set of trenches approximately perpendicular to the first set of trenches. In this way, the first pattern that is used to form the first set of trenches, and the second pattern that is used to form the second set of trenches, have a higher resolution relative to a pattern that is formed in the same photoresist layer in a single patterning operation. This increases the sharpness of the first pattern and the second pattern, which may reduce corner rounding at or near the intersections of the first set of trenches and the second set of trenches. Moreover, the first set of trenches may be filled with a material to prevent the intersections from being further etched during the second etch operation, which may reduce etch loading at and/or near the intersections.

In some implementations, another double patterning technique includes forming a first portion of a pattern in a first direction in a hard mask layer using a first photoresist pattern, and forming a second portion of the pattern in a second direction in the hard mask layer using a second photoresist pattern. This may be used to increase the resolution of the pattern in the hard mask layer. The pattern in the hard mask layer is then used to etch a plurality of intersecting trenches in a substrate. The plurality of intersecting trenches may be filled to form a DTI structure in the substrate.

In this way, the double patterning techniques described herein may be used to achieve ultra-high-aspect-ratio deep trench isolation (DTI) structures (e.g., BDTI structures or frontside DTI (FDTI) structures) that may be included in a pixel array, a complementary metal oxide semiconductor (CMOS) image sensor (CIS), and/or another type of semiconductor device. In particular, reduced corner rounding and reduced etch loading provided by the double patterning techniques described herein may be used to reduce BDTI structure width and may be used to achieve an aspect ratio for a DTI structure (e.g., a ratio between the height or depth of the DTI structure and the width of the DTI structure) in a range of approximately 20 to approximately 50 or greater. The increased aspect ratio of the DTI structure may provide increased full well capacity for pixel sensors isolated by the DTI structure (e.g., the amount of charge that the pixel sensors can hold before saturating) and/or may increase the optical and/or electrical isolation performance of the DTI structure, among other examples.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet (UV) light source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
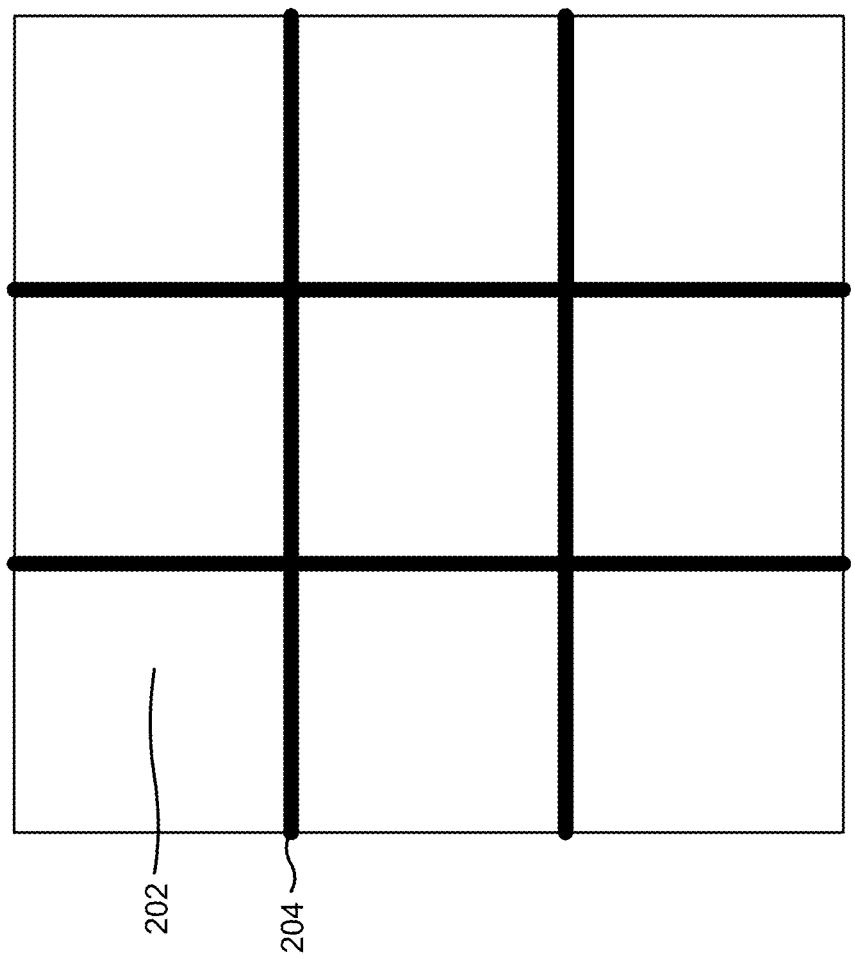
FIGS. 2 and 3 are diagrams of example pixel arrays described herein.

FIG. 2 shows a top-down view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as rectangle shapes, circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) is approximately 1 micron. In some implementations, the size of the pixel sensors 202 (e.g., the width or the diameter) of the pixel sensors 202 is less than approximately 1 micron. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

The pixel sensors 202 may be electrically and optically isolated by a DTI structure 204 included in the pixel array 200. The DTI structure 204 may include a plurality of interconnected trenches that are filled with a dielectric material such as an oxide. The trenches of the DTI structure 204 may be included around the perimeters of the pixel sensors 202 such that the DTI structure 204 surrounds the pixel sensors 202, as shown in FIG. 2. Moreover, the trenches of the DTI structure 204 may extend into a substrate in which the pixel sensors 202 are formed to surround the photodiodes and other structures of the pixel sensors 202 in the substrate. As indicated above, the pixel array 200 may be included in a BSI CMOS image sensor. In these examples, the DTI structure 204 may include a BDTI structure with a high aspect ratio that is formed from the backside of the pixel array 200.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal. For a BSI CMOS image sensor, the transistor layer may be located between the BEOL metallization stack layers and a lens layer. For a FSI CMOS image sensor, the BEOL metallization stack layers may be located between the transistor layer and the lens layer.

As indicated above, FIG. 2 is provided as an example. Other examples may differ from what is described with regard to FIG. 2.

Figure 3:
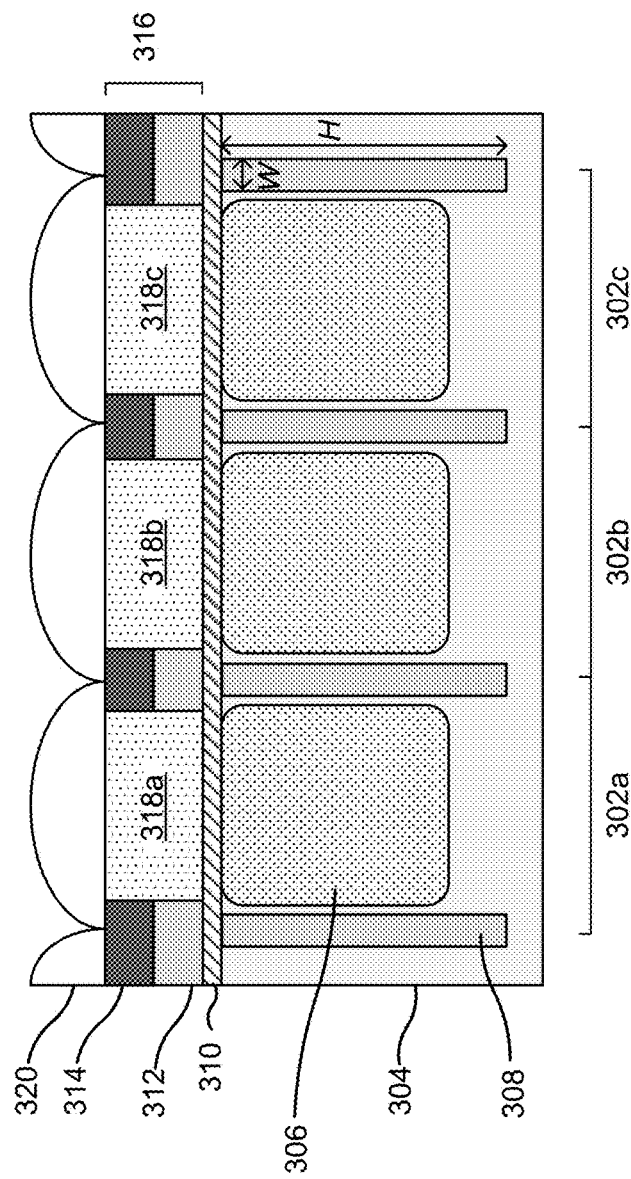

FIG. 3 is a diagram of an example pixel array 300 described herein. In some implementations, the pixel array 300 is configured as and/or implements a pixel sensor 202 and be included in the pixel array 200. In some implementations, the pixel array 300 may be included in an image sensor. The image sensor may be a CMOS image sensor, a BSI CMOS image sensor, or another type of image sensor.

As shown in FIG. 3, the pixel array 300 may include a plurality of adjacent pixel sensors, such as pixel sensors 302a-302c. In some implementations, the pixel sensors 302a-302c are configured as pixel sensors 202 included in the pixel array 200. In some implementations, the pixel sensors 302a-302c include various shapes of pixel sensors, such as square-shaped pixel sensors, octagon-shaped pixel sensors, pixel sensors of another shape, or a combination thereof. The pixel array 300 may include a greater quantity or a lesser quantity of pixel sensors than the quantity illustrated in FIG. 3.

The pixel sensors 302 may be formed in a substrate 304, which may include a semiconductor die substrate, a semiconductor wafer, or another type of substrate in which semiconductor pixels may be formed. In some implementations, the substrate 304 is formed of silicon (Si), a material including silicon, a III-V compound semiconductor material such as gallium arsenide (GaAs), a silicon on insulator (SOI), or another type of semiconductor material that is capable of generating a charge from photons of incident light.

Each pixel sensor 302 may include a photodiode 306. A photodiode 306 may include a region of the substrate 304 that is doped with a plurality of types of ions to form a p-n junction or a PIN junction (e.g., a junction between a p-type portion, an intrinsic (or undoped) type portion, and an n-type portion). For example, the substrate 304 may be doped with an n-type dopant to form a first portion (e.g., an n-type portion) of a photodiode 306 and a p-type dopant to form a second portion (e.g., a p-type portion) of the photodiode 306. A photodiode 306 may be configured to absorb photons of incident light. The absorption of photons causes a photodiode 306 to accumulate a charge (referred to as a photocurrent) due to the photoelectric effect. Here, photons bombard the photodiode 306, which causes emission of electrons of the photodiode 306. The emission of electrons causes the formation of electron-hole pairs, where the electrons migrate toward the cathode of the photodiode 306 and the holes migrate toward the anode, which produces the photocurrent.

A DTI structure 308 may be included in the substrate 304 between adjacent pixel sensors 302. The DTI structure 308 may provide optical isolation by blocking or preventing diffusion or bleeding of light from one pixel sensor 302 to another pixel sensor 302, thereby reducing crosstalk between adjacent pixel sensors 302. The DTI structure 308 may include a plurality of trenches and/or other types of structures that are filled with one or more materials. The trenches of the DTI structure 308 may include sets of intersecting trenches that are approximately perpendicular to form a grid layout. In the grid layout, the trenches may extend around the perimeters of the pixel sensors 302 in the pixel array 300 and may intersect at various locations of the pixel array 300. The DTI structure 308 may extend into the substrate 304 (e.g., from a top surface of the substrate 304 and/or from a bottom surface or backside of the substrate 304) to a depth such that the DTI structure 308 extends deeper than the photodiodes 306 in the substrate 304. In some implementations, the DTI structure 308 extends to approximately the same depth as a bottom surface of the photodiodes 306, or extends to less than the depth of the bottom surface of the photodiodes 306. In some implementations, the DTI structure 308 is formed in the backside of the substrate 304 to provide optical isolation between the pixel sensors 302, and thus may be referred to as a BDTI structure.

The one or more materials included in the DTI structure 308 may function as a dielectric buffer layer between the photodiodes 306 and the layers above the photodiodes 306. The one or more materials may include a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), and/or another type of oxide material.

The trenches of the DTI structure 308 (or a subset thereof) may be formed by one or more of the double patterning techniques described herein. The double patterning techniques described herein may enable the DTI structure 308 to be formed to a high aspect ratio (or an ultra-high aspect ratio) between a width (W) of the trenches and a height (H) (or depth) of the trenches. As an example, the double patterning techniques described herein may enable the DTI structure 308 to be formed to an aspect ratio in a range of approximately 20 to approximately 50 to achieve a greater DTI structure height (H) and/or a smaller trench width (W), which may provide increased full well capacity (FWC) and/or increased isolation performance for the DTI structure 308. An example range of the height (H) of the trenches of the DTI structure 308 includes approximately 2 microns to approximately 4 microns to provide sufficient optical isolation and to reduce damage to the substrate 304. An example, range of the width of the DTI structure 308 include approximately 80 nanometers to approximately 100 nanometers to provide sufficient optical isolation and to reduce damage to the substrate 304. These values are provided as examples. Other values for the height (H), the width (W), and/or the aspect ratio are within the scope of the present disclosure.

An antireflective coating (ARC) 310 may be optionally included over and/or on the substrate 304, over and/or on the DTI structure 308, and/or over and/or on the photodiodes 306. The ARC 310 may include a suitable material for reducing a reflection of incident light projected toward the photodiode 306. For example, the ARC 310 may include a nitrogen-containing material and/or another type of material.

A dielectric layer 312 may be included over and/or on the ARC 310. The dielectric layer 312 may include an organic material, an oxide, a nitride, and/or another type of dielectric material such as a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), a silicon nitride ($Si_xN_y$), a zirconium oxide ($ZrO_x$), a magnesium oxide ($MgO_x$), a yttrium oxide ($Y_xO_y$), a tantalum oxide ($Ta_xO_y$), a titanium oxide ($TiO_x$), a lanthanum oxide ($La_xO_y$), a barium oxide ($BaO_x$), a silicon carbide (SiC), a lanthanum aluminum oxide ($LaAlO_x$), a strontium oxide (SrO), a zirconium silicon oxide ($ZrSiO_x$), and/or a calcium oxide (CaO), among other examples.

A metal layer 314 may be included over and/or on the dielectric layer 312. The metal layer 314 may include a metallic material such as tungsten (W), copper (Cu), aluminum (Al), cobalt (Co), nickel (Ni), titanium (Ti), tantalum (Ta), another type of conductive material, and/or an alloy including one or more of the foregoing. The metal layer 314 may be configured to reflect a portion of incident light to reduce optical crosstalk.

A grid structure 316 may be included over and/or on the ARC 310, over the DTI structure 308, and/or over the substrate 304. The grid structure 316 may include a plurality of interconnected columns formed from one or more layers that are etched to form the columns. The grid structure 316 may be included above the pixel sensors 302 and may surround the perimeters of the pixel sensors 302. The grid structure 316 may be configured to provide optical isolation and additional crosstalk reduction in combination with the DTI structure 308.

In some implementations, the grid structure 316 includes the dielectric layer 312 and the metal layer 314, and may be referred to as a metal grid or a composite metal grid (CMG). The metal layer 314 may be configured to reflect and/or absorb incident light to reduce optical crosstalk between adjacent pixel sensors 302. In some implementations, the metal layer 314 is omitted from the grid structure 316, and the grid structure 316 may be referred to as an oxide grid, a dielectric grid, or a color filter in a box (CIAB) grid, among other examples.

Respective color filter regions 318 may be included in the areas between the grid structure 316. For example, a color filter region 318a may be formed in between columns of the grid structure 316 over the photodiode 306 of the pixel sensor 302a, a color filter region 318b may be formed in between columns of the grid structure 316 over the photodiode 306 of the pixel sensor 302b, a color filter region 318c may be formed in between columns of the grid structure 316 over the photodiode 306 of the pixel sensor 302c, and so on. A refractive index of the color filter regions 318 may be greater relative to a refractive index of the grid structure 316 to increase a likelihood of a total internal reflection in the color filter regions 318 at an interface between the sidewalls of the color filter regions 318 and the sidewalls of the grid structure 316, which may increase the quantum efficiency of the pixel sensors 302.

Each color filter region 318 may be configured to filter incident light to allow a particular wavelength of the incident light to pass to a photodiode 306 of an associated pixel sensor 302. For example, the color filter region 318a included in the pixel sensor 302a may filter red light for the pixel sensor 302a (and thus, the pixel sensor 302a may be a red pixel sensor), the color filter region 318b included in the pixel sensor 302b may filter green light for the pixel sensor 302*b* (and thus, the pixel sensor 302*b* may be a green pixel sensor), the color filter region 318*c* included in the pixel sensor 302*c* may filter blue light for the pixel sensor 302*c* (and thus, the pixel sensor 302*c* may be a blue pixel sensor), and so on.

A blue filter region may permit the component of incident light near a 450 nanometer wavelength to pass through a color filter region 318 and block other wavelengths from passing. A green filter region may permit the component of incident light near a 550 nanometer wavelength to pass through a color filter region 318 and block other wavelengths from passing. A red filter region may permit the component of incident light near a 650 nanometer wavelength to pass through a color filter region 318 and block other wavelengths from passing. A yellow filter region may permit the component of incident light near a 580 nanometer wavelength to pass through a color filter region 318 and block other wavelengths from passing.

In some implementations, a color filter region 318 may be non-discriminating or non-filtering, which may define a white pixel sensor. A non-discriminating or non-filtering color filter region 318 may include a material that permits all wavelengths of light to pass into the associated photodiode 306 (e.g., for purposes of determining overall brightness to increase light sensitivity for the image sensor). In some implementations, a color filter region 318 may be an NIR bandpass color filter region, which may define a near infrared (NIR) pixel sensor. An NIR bandpass color filter region 318 may include a material that permits the portion of incident light in an NIR wavelength range to pass to an associated photodiode 306 while blocking visible light from passing.

A micro-lens layer 320 may be included above and/or on the color filter regions 318. The micro-lens layer 320 may include a respective micro-lens for each of the pixel sensors 302. For example, a micro-lens may be formed to focus incident light toward the photodiode 306 of the pixel sensor 302*a*, another micro-lens may be formed to focus incident light toward the photodiode 306 of the pixel sensor 302*b*, another micro-lens may be formed to focus incident light toward the photodiode 306 of the pixel sensor 302*c*, and so on.

As indicated above, FIG. 3 is provided as an example. Other examples may differ from what is described with regard to FIG. 3. For a FSI CMOS image sensor, the DTI structure 308 may extend from the opposite side of the substrate 304, such as to the bottom side of the substrate 304 of FIG. 3.

Figure 4B:
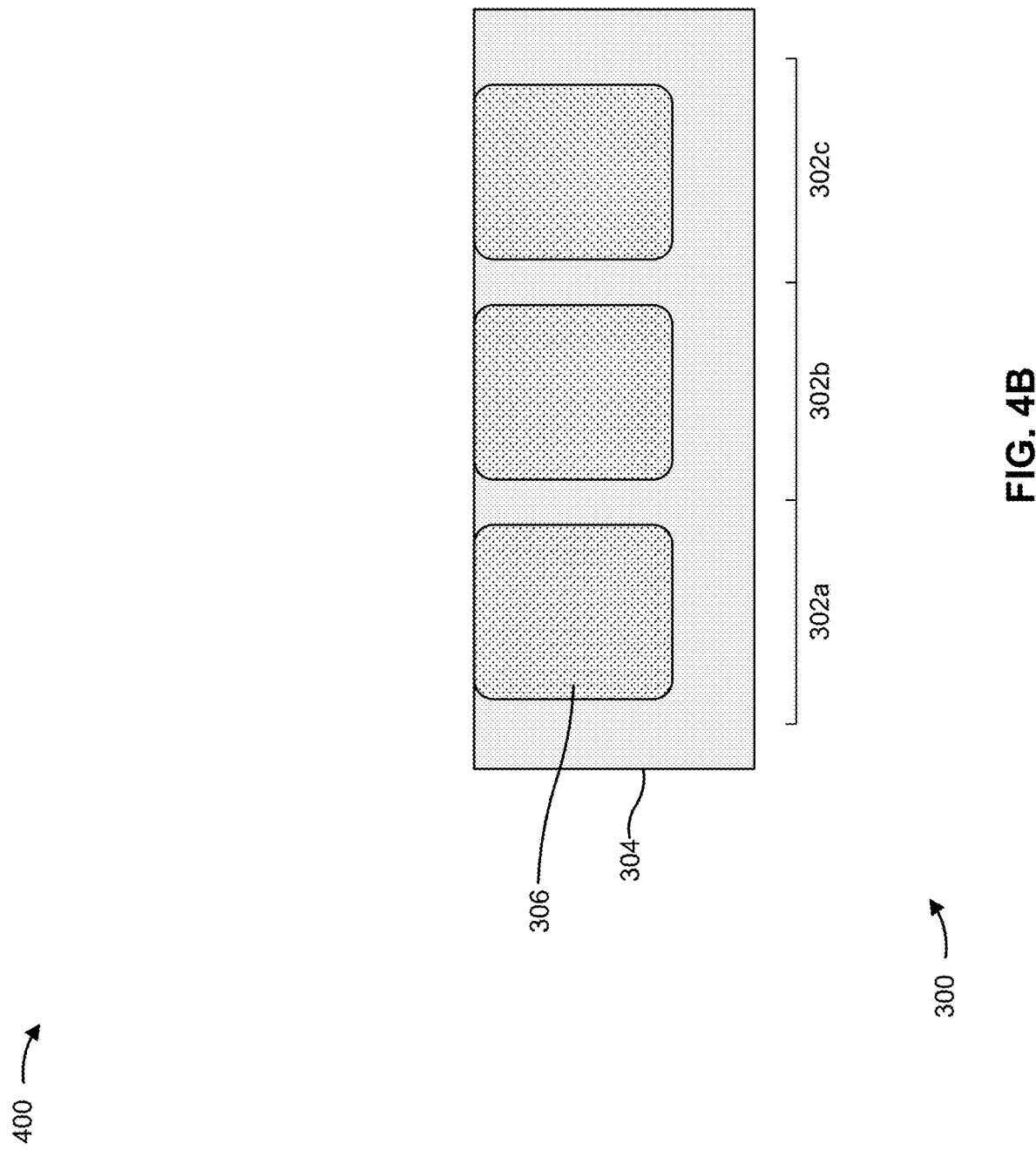
FIGS. 4A-4R and 5A-5N are diagrams of example implementations described herein.
Figure 4C:
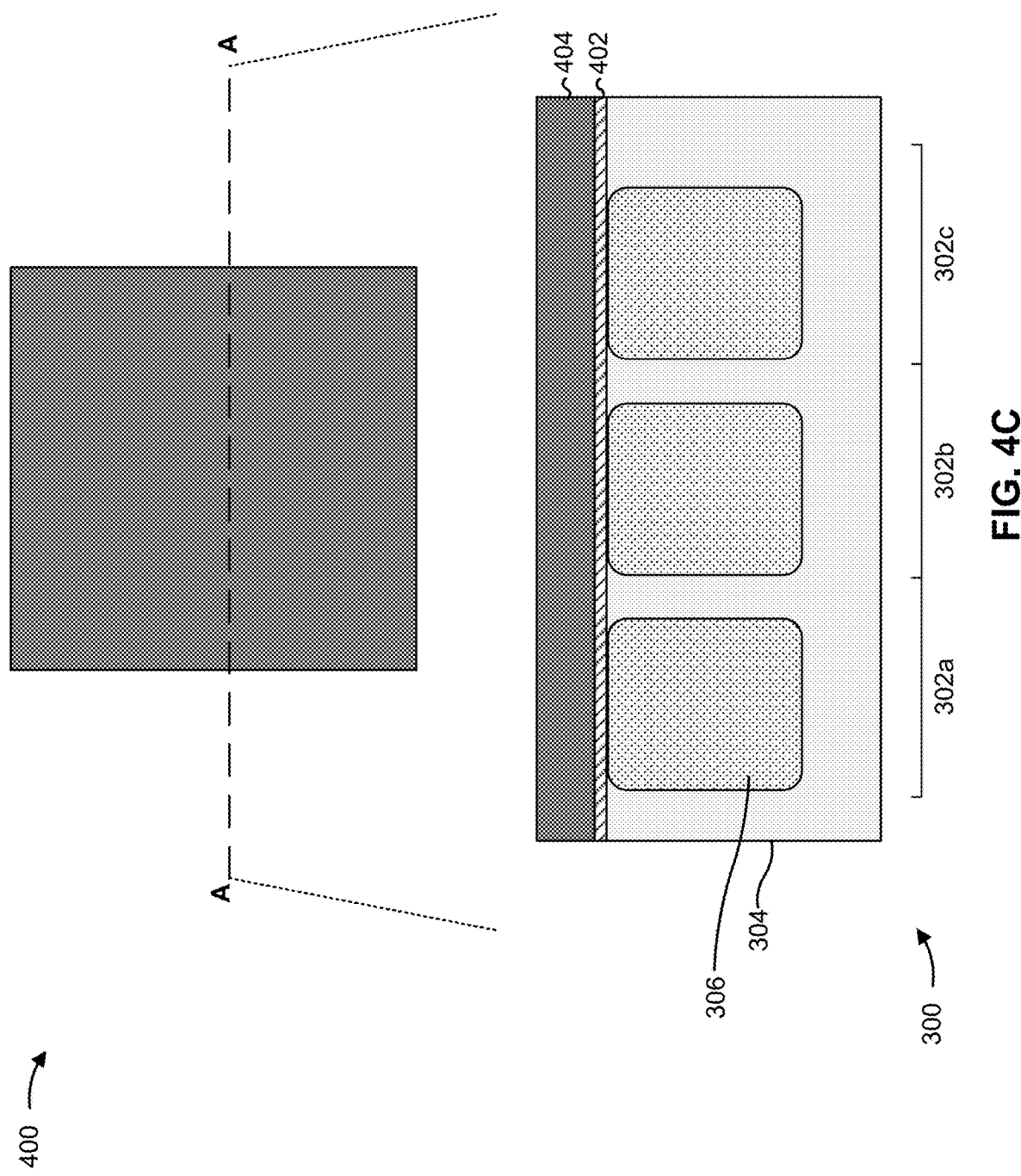
Figure 4D:
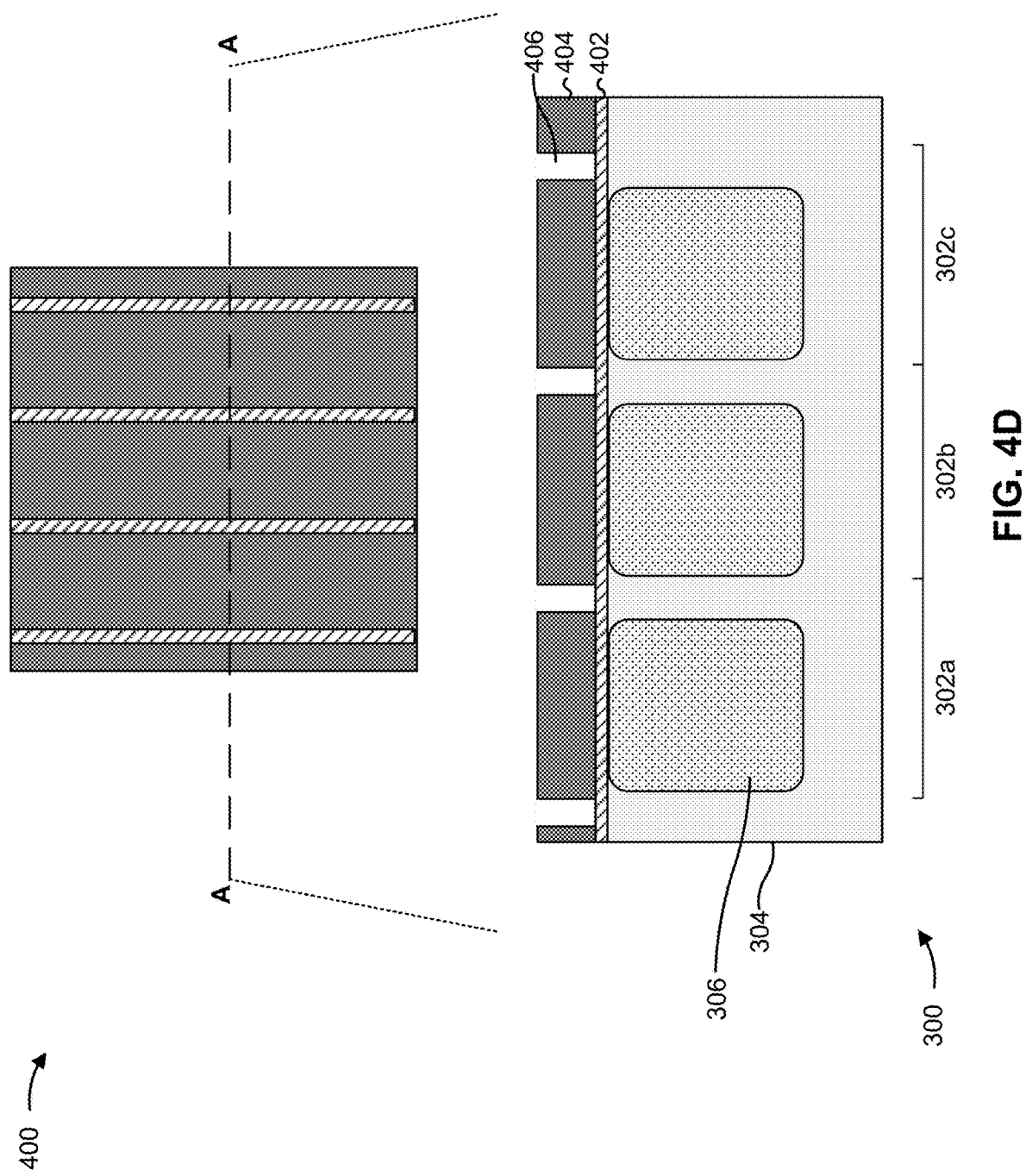
Figure 4E:
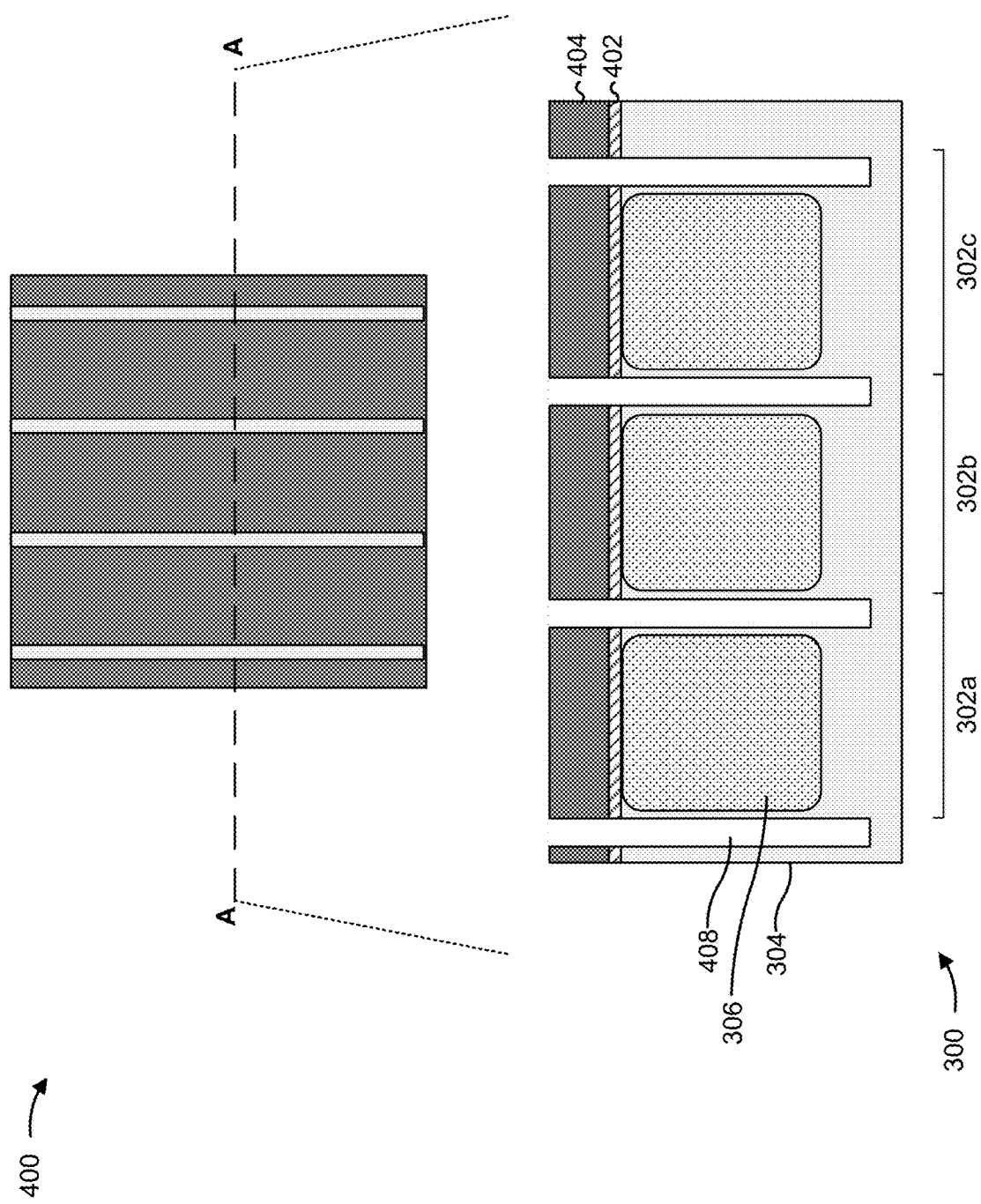
Figure 4H:
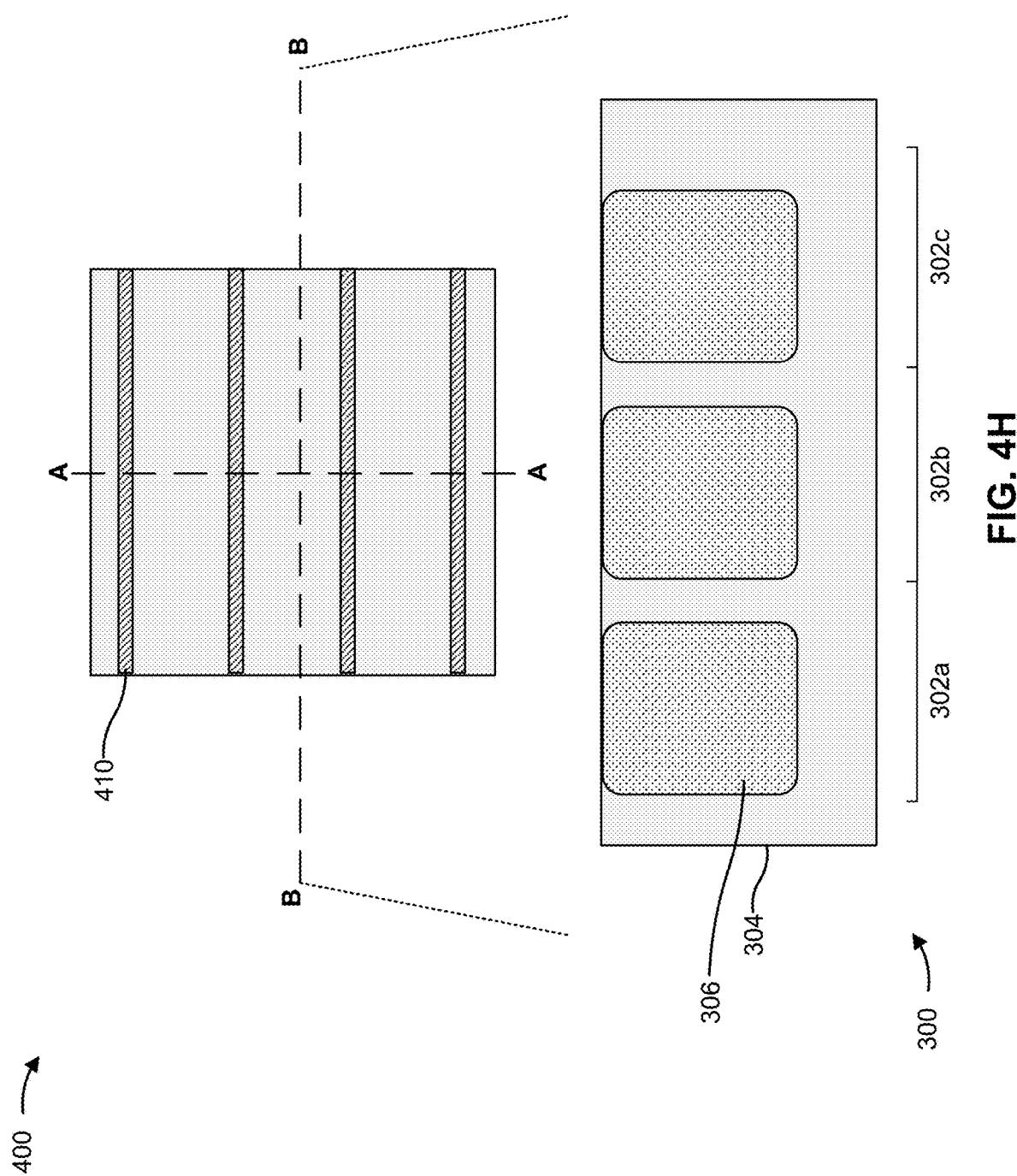
Figure 4J:
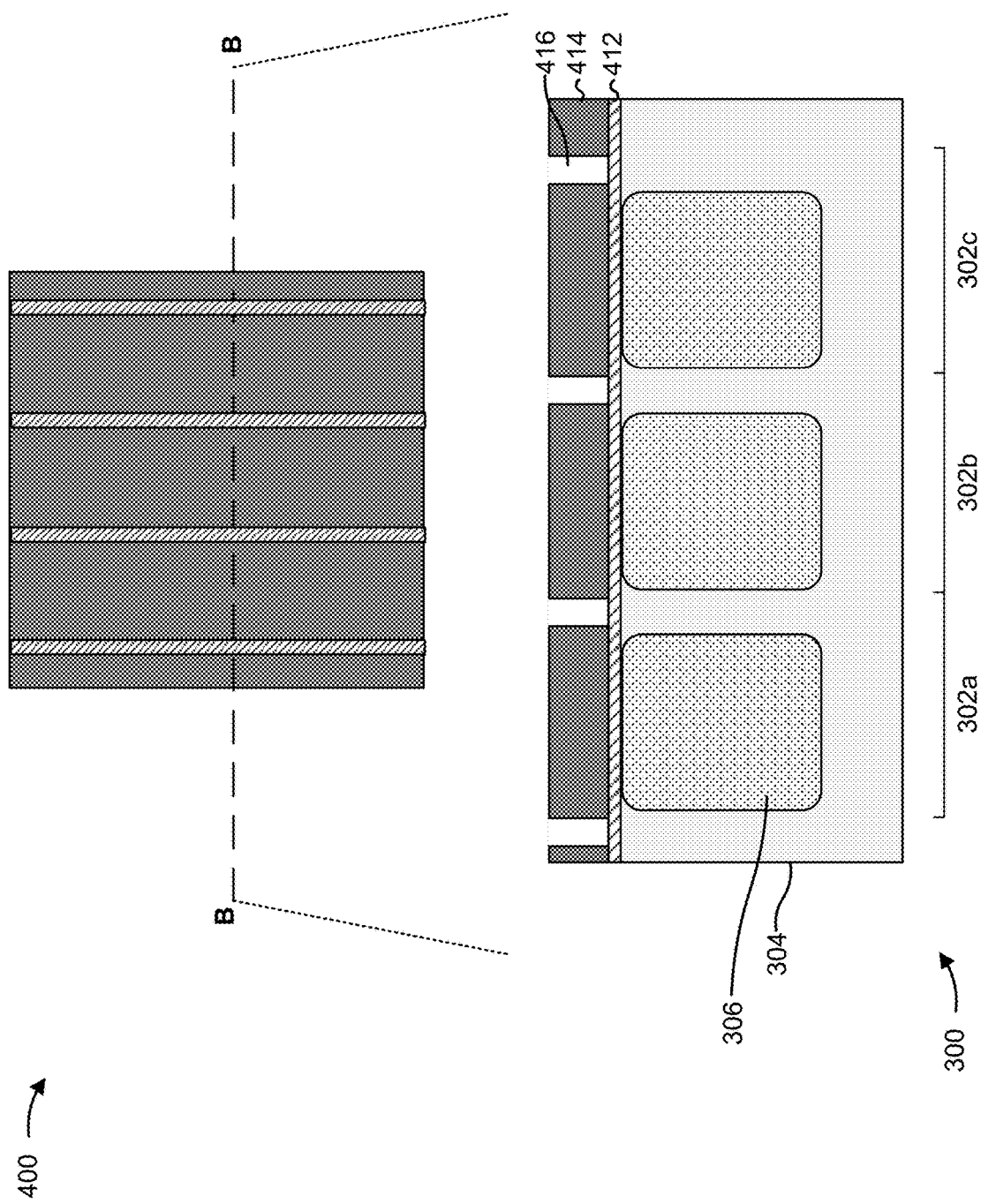
Figure 4K:
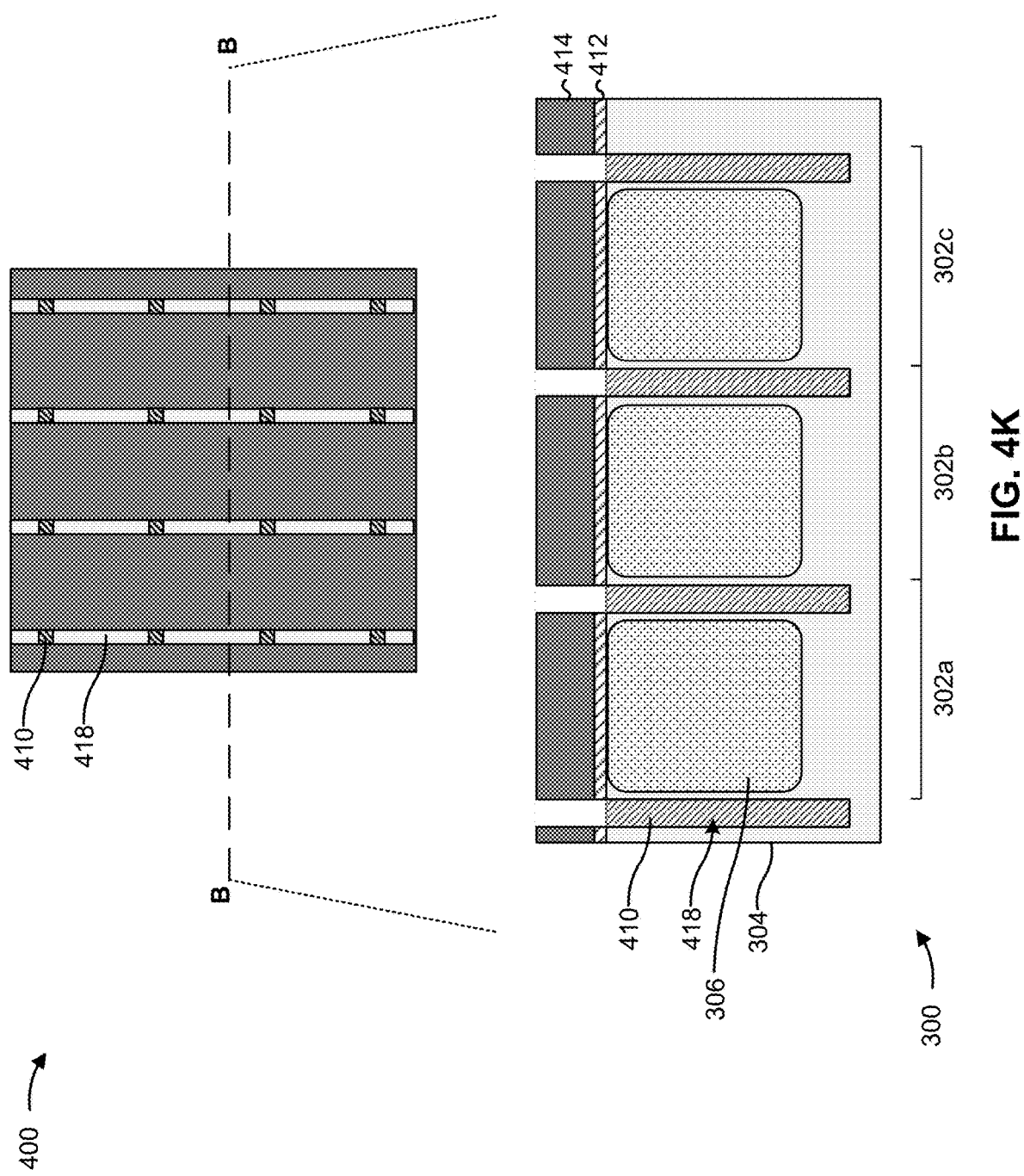
Figure 4L:
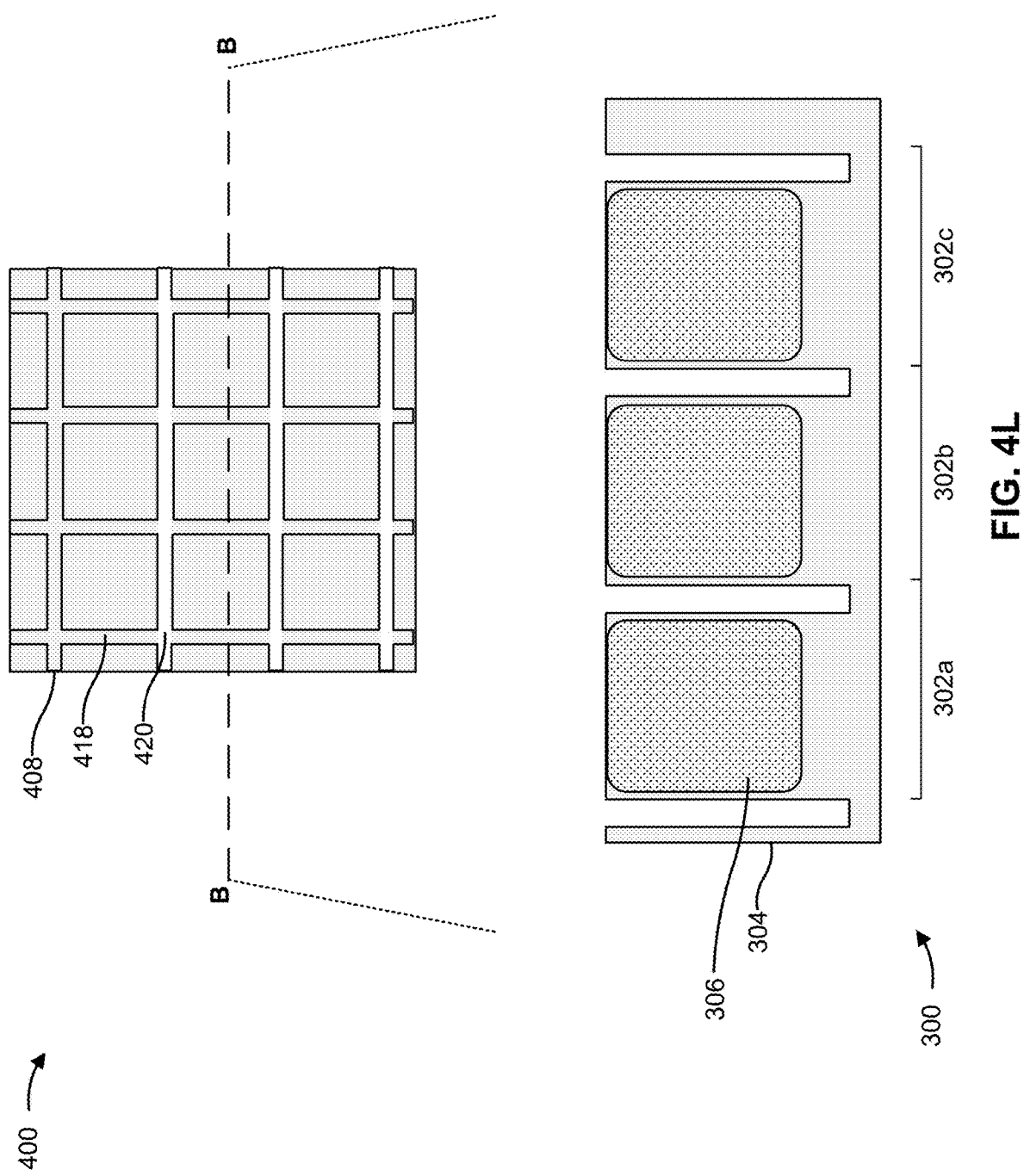
Figure 4M:
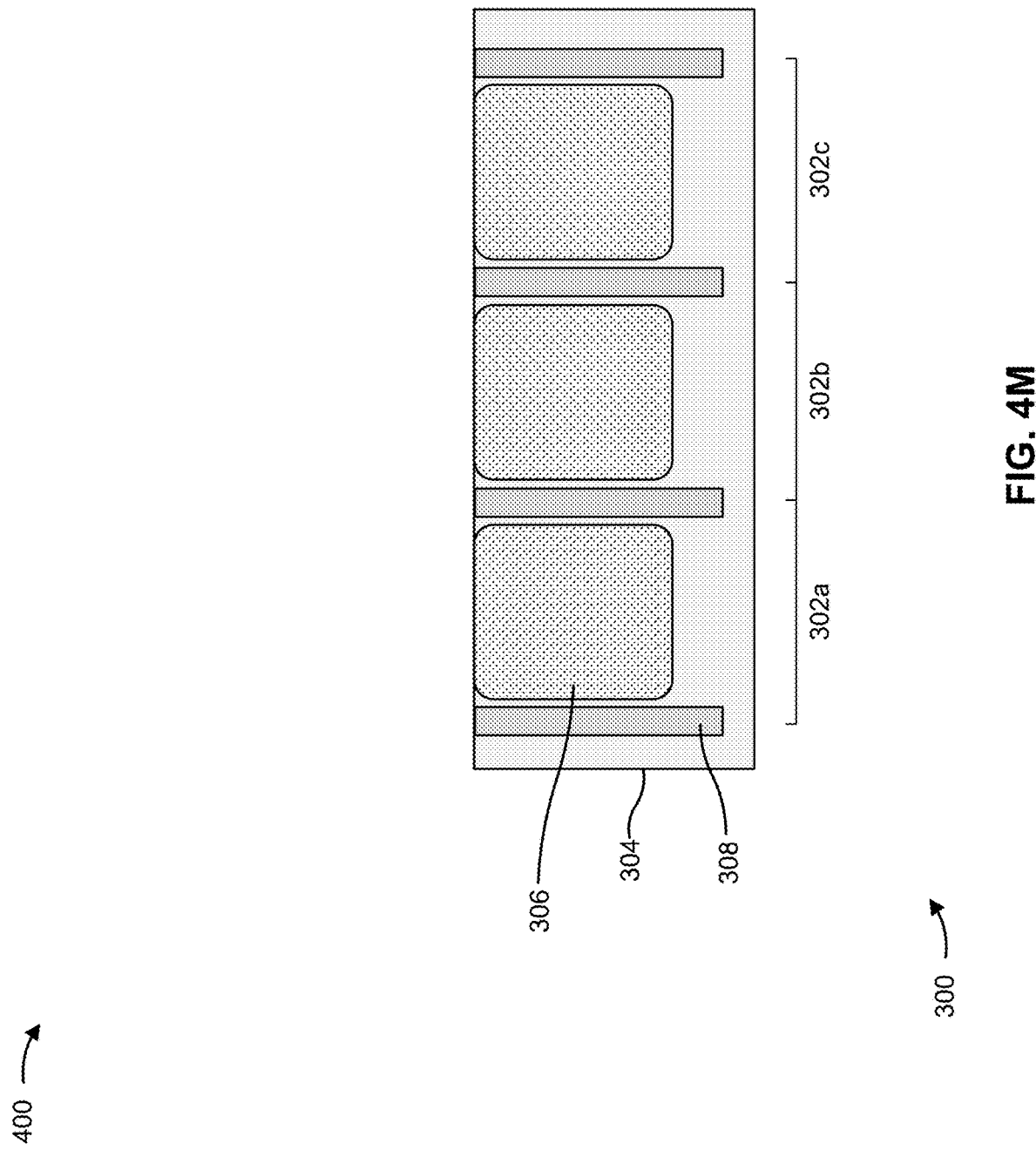
Figure 4N:
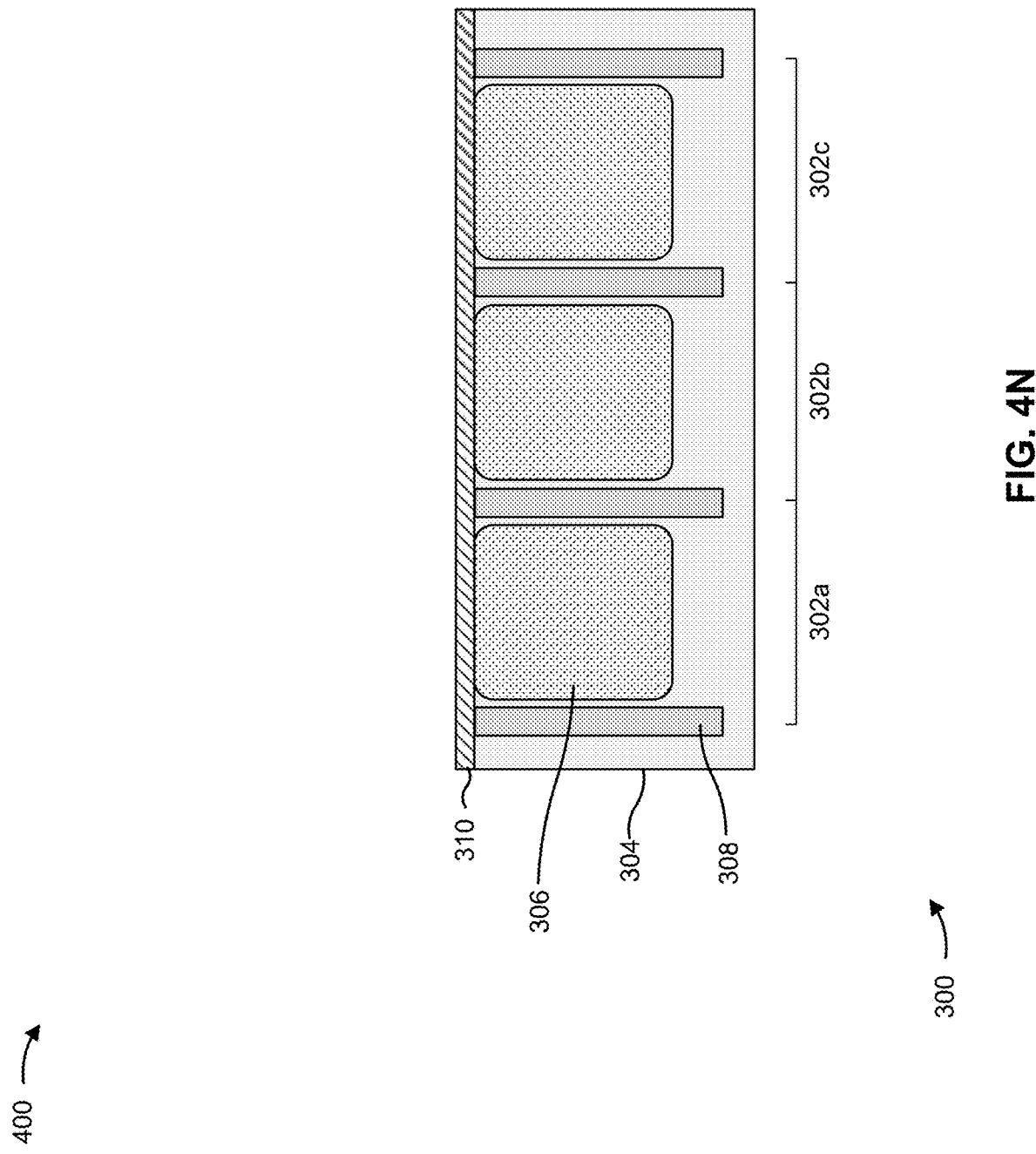
Figure 4O:
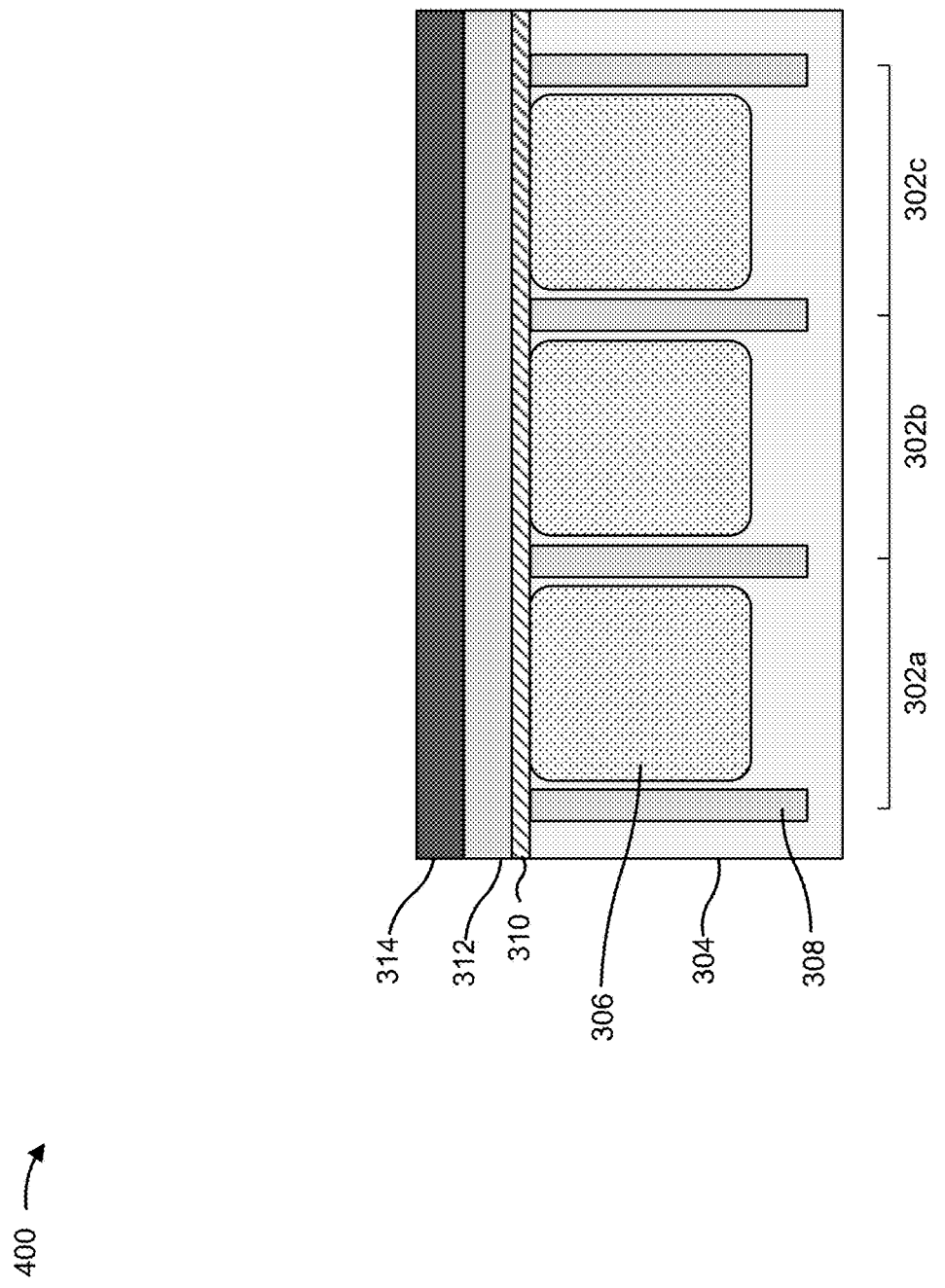
Figure 4P:
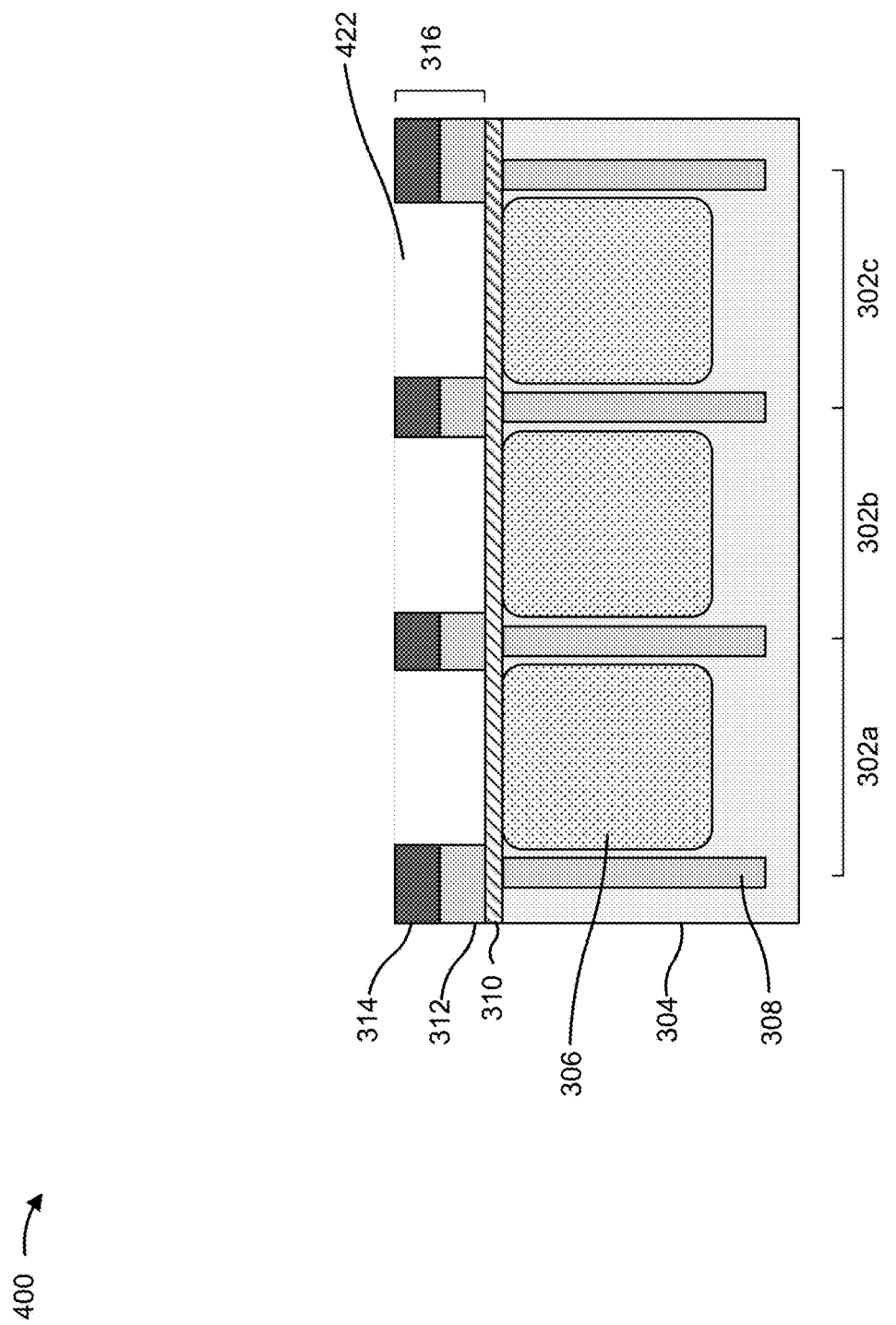
Figure 4Q:
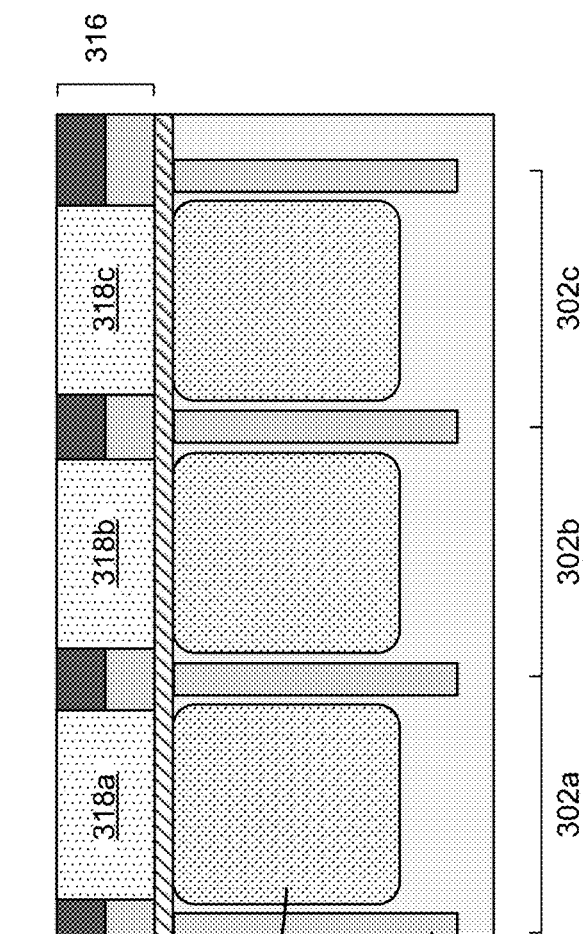
Figure 4R:
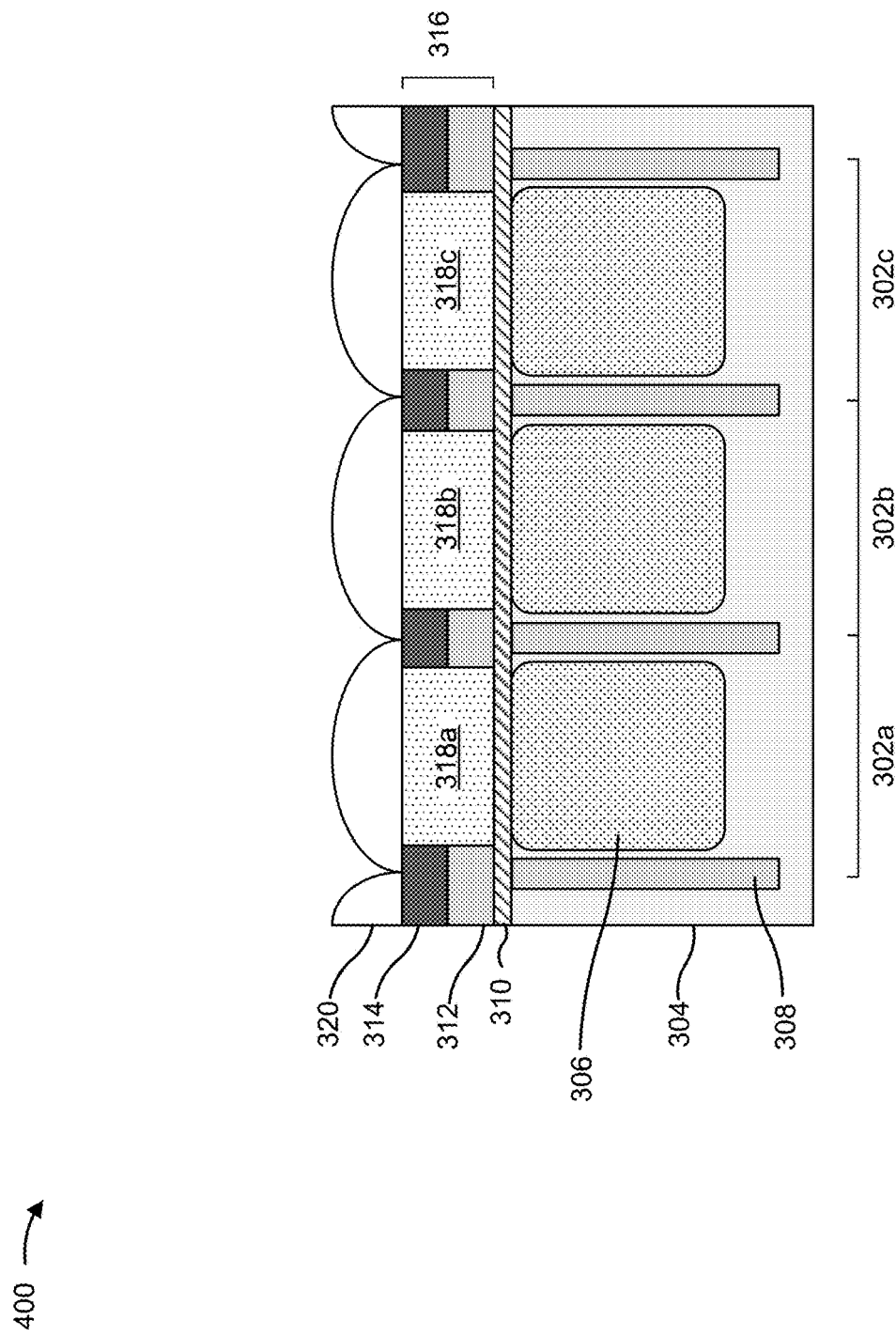

FIGS. 4A-4R are diagrams of an example implementation 400 described herein. The example implementation 400 may be an example process or method for forming the pixel array 300. The example implementation 400 may include a double patterning technique for forming the DTI structure 308 of the pixel array 300. The double patterning technique described in connection with FIGS. 4A-4R may reduce and/or prevent corner rounding and etch loading at and/or near intersections of the trenches of the DTI structure 308. Accordingly, the double patterning technique described in connection with FIGS. 4A-4R may increase the sharpness of the trenches and may increase depth uniformity of the trenches. Moreover, the double patterning technique described in connection with FIGS. 4A-4R may be used to form DTI structures of ultra-high aspect ratios and/or may enable the reduction of pixel sensor sizes (or pixel sensor pitches) to sub-micron sizes.

As shown in FIG. 4A, the pixel sensors 302 (e.g., the pixel sensor 302*a*, the pixel sensor 302*b*, the pixel sensor 302*c*, and so on) may be formed in the substrate 304. The substrate 304 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

As shown in the cross-sectional view in FIG. 4B, one or more semiconductor processing tools may form a plurality of photodiodes 306 in the substrate 304. For example, the ion implantation tool 114 may dope the portions of the substrate 304 using an ion implantation technique to form a respective photodiode 306 for a plurality of pixel sensors 302 (e.g., pixel sensors 302*a*-302*c*). The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

FIG. 4C illustrates a top-down view of the pixel array 300 and a cross-sectional view along the line AA. As shown in FIG. 4C, one or more layers may be formed over and/or on the substrate 304 in preparation for a first etch operation, such as a first ARC 402 and a first photoresist layer 404. The first photoresist layer 404 may be used as a lithography patterning layer in which a pattern is transferred in an exposure operation. The first photoresist layer 404 may be patterned in preparation for etching a first plurality of trenches into the substrate 304. The first ARC 402 may be provided to improve the lithography patterning performance of the first photoresist layer 404.

The deposition tool 102 may deposit the first ARC 402 using various PVD techniques, CVD techniques and/or ALD techniques, such as sputtering, PECVD, HDP-CVD, SACVD, and/or PEALD, among other examples. The deposition tool 102 may form the first ARC 402 to a thickness of approximately 600 angstroms to approximately 800 angstroms based on one or more etching parameters for etching trenches into the substrate 304 such as a target depth and/or a target width of the trenches. However, other values for the thickness of the first ARC 402 are within the scope of the present disclosure.

The first photoresist layer 404 may include a photoresist material, and the photoresist material may be formed by using a coating technique, such as a spin-coating technique and a curing technique, to form the first photoresist layer 404. The first photoresist layer 404 may have a thickness of approximately 3000 angstroms to approximately 7000 angstroms based on one or more etching parameters for etching trenches into the substrate 304 such as a target depth and/or a target width of the trenches. For example, the deeper the target trench is, the thicker the first photoresist layer 404 is. However, other values for the thickness of the first photoresist layer 404 are within the scope of the present disclosure.

FIG. 4D illustrates another top-down view of the pixel array 300 and another cross-sectional view along the line AA. As shown in FIG. 4D, a first pattern 406 may be formed in the first photoresist layer 404 by removing a plurality of portions of the first photoresist layer 404. The first pattern 406 may be formed by exposing the first photoresist layer 404 to a radiation source (e.g., using the exposure tool 104) and removing either the exposed portions or the non-exposed portions of the first photoresist layer 404 (e.g., using developer tool 106). In this way, the first pattern 406 is formed through the first photoresist layer 404 (e.g., from a top surface of the first photoresist layer 404 through the first photoresist layer 404 to the bottom surface of the first photoresist layer 404) to the first ARC 402.

FIG. 4E illustrates another top-down view of the pixel array 300 and another cross-sectional view along the line AA. As shown in FIG. 4E, a plurality of first trenches 408 may be formed into at least a portion of the substrate 304. In particular, the etch tool 108 may etch through the first ARC 402 and into the substrate 304 (e.g., from a top surface of the substrate 304) to form the first plurality of trenches 408 based on the first pattern 406 in the first photoresist layer 404. The etch tool 108 may perform a first etch operation to form or etch the first plurality of trenches 408 in a first direction in the substrate 304 (e.g., in which the first plurality of trenches 408 may be approximately parallel and extend in the first direction), as shown in the example in FIG. 4E. The plurality of first trenches 408 may be formed in between the photodiodes 306, as shown in the example in FIG. 4E.

FIG. 4F illustrates another top-down view of the pixel array 300 and another cross-sectional view along the line AA. As shown in FIG. 4F the remaining portions of the first photoresist layer 404 and the remaining portions of the first ARC 402 may be removed from the substrate 304. Various techniques may be used to remove the remaining portions of the first photoresist layer 404 and the remaining portions of the first ARC 402, such as selective etching, ashing (e.g., plasma ashing), and/or photoresist stripping, among other examples.

As further shown in FIG. 4F, the first plurality of trenches 408 may be formed to one or more dimensions, such as a width (W) and/or a depth (D). As an example, the etch tool 108 may form the first plurality of trenches 408 (or a portion thereof) to a depth (D) in a range of approximately 2 microns to approximately 4 microns to provide sufficient optical isolation between adjacent pixel sensors 302 and to reduce damage to the substrate 304. As an example, the etch tool 108 may form the first plurality of trenches 408 (or a portion thereof) to a width (W) of approximately 80 nanometers to approximately 100 nanometers to provide sufficient optical isolation between adjacent pixel sensors 302 and to reduce damage to the substrate 304. However, other values for the depth (D) and the width (W) are within the scope of the present disclosure. In some implementations, the etch tool 108 may form the first plurality of trenches 408 (or a portion thereof) to an aspect ratio (e.g., an ultra-high aspect ratio) between the width (W) and the depth (D) in a range of approximately 20 to approximately 50 to provide increased full well capacity and/or increased isolation performance for the DTI structure 308. However, other values for the aspect ratio are within the scope of the present disclosure.

FIG. 4G illustrates another top-down view of the pixel array 300 and another cross-sectional view along the line AA. As shown in FIG. 4G, the first plurality of trenches 408 may be filled with a blocking material 410. The blocking material 410 may include a photoresist material, an ARC material, and/or another type of material that is deposited into the first plurality of trenches 408 to protect the first plurality of trenches 408 from being further etched during a subsequent etching operation to form a second plurality of trenches in the substrate 304. In this way, the blocking material 410 may reduce and/or prevent etch loading and/or over etching in the first plurality of trenches 408. The deposition tool 102 may deposit the blocking material 410 using a spin-coating technique, various PVD techniques, CVD techniques and/or ALD techniques, such as sputtering, PECVD, HDP-CVD, SACVD, and/or PEALD, among other examples.

FIG. 4H illustrates another top-down view of the pixel array 300 and a cross-sectional view along the line BB. As shown in FIG. 4H, the cross-sectional view along the line BB may include a cross section of the pixel array 300 that is approximately 90 degrees relative to the cross-sectional views along the line AA.

FIG. 4I illustrates another top-down view of the pixel array 300 and another cross-sectional view along the line BB. As shown in FIG. 4I, one or more layers may be formed over and/or on the substrate 304 in preparation for a second etch operation, such as a second ARC 412 and a second photoresist layer 414. The second photoresist layer 414 may be used as a lithography patterning layer in which a pattern is transferred in an exposure operation. The second photoresist layer 414 may be patterned in preparation for etching a second plurality of trenches into the substrate 304. The second ARC 412 may be provided to improve the lithography patterning performance of the second photoresist layer 414. The second ARC 412 and the second photoresist layer 414 may be formed after removal of the first ARC 402 and the first photoresist layer 404.

The deposition tool 102 may deposit the second ARC 412 using various PVD techniques, CVD techniques and/or ALD techniques, such as sputtering, PECVD, HDP-CVD, SACVD, and/or PEALD, among other examples. The deposition tool 102 may form the second ARC 412 to a thickness of approximately 600 angstroms to approximately 800 angstroms based on one or more etching parameters for etching trenches into the substrate 304 such as a target depth and/or a target width of the trenches. However, other values for the thickness of the second ARC 412 are within the scope of the present disclosure.

The second photoresist layer 414 may include a photoresist material, and the deposition tool 102 may deposit the photoresist material using a deposition technique, such as a spin-coating technique, to form the second photoresist layer 414. The deposition tool 102 may form the second photoresist layer 414 to a thickness of approximately 3000 angstroms to approximately 7000 angstroms based on one or more etching parameters for etching trenches into the substrate 304 such as a target depth and/or a target width of the trenches. However, other values for the thickness of the second photoresist layer 414 are within the scope of the present disclosure.

FIG. 4J illustrates another top-down view of the pixel array 300 and another cross-sectional view along the line BB. As shown in FIG. 4J, a second pattern 416 may be formed in the second photoresist layer 414 by removing a plurality of portions of the second photoresist layer 414. The second pattern 416 may be formed by exposing the second photoresist layer 414 to a radiation source (e.g., using the exposure tool 104) and removing either the exposed portions or the non-exposed portions of the second photoresist layer 414 (e.g., using developer tool 106). In this way, the second pattern 416 is formed through the second photoresist layer 414 (e.g., from a top surface of the second photoresist layer 414 through the second photoresist layer 414 to the bottom surface of the second photoresist layer 414) to the second ARC 412.

FIG. 4K illustrates another top-down view of the pixel array 300 and another cross-sectional view along the line BB. As shown in FIG. 4K, a plurality of second trenches 418 may be formed into at least a portion of the substrate 304. In particular, the etch tool 108 may perform a second etch operation, which may be separate from and subsequent to the first etch operation described above in connection with FIG. 4E, to etch through the second ARC 412 and into the substrate 304 (e.g., from a top surface of the substrate 304) to form the second plurality of trenches 418 based on the second pattern 416 in the second photoresist layer 414. The etch tool 108 may form or etch the second plurality of trenches 418 in a second direction in the substrate 304 (e.g., in which the second plurality of trenches 418 may be approximately parallel and extend in the second direction), as shown in the example in FIG. 4K. The second direction may be approximately perpendicular to the first direction. The second plurality of trenches 418 (or a subset thereof) in the substrate 304 may be formed a same or similar width (W), depth (D), and/or aspect ratio as the first plurality of trenches 408. The second plurality of trenches 418 may be formed in between the photodiodes 306, as shown in the example in FIG. 4K.

As further shown in FIG. 4K, the second etch operation may result in portions of the first plurality of trenches 408 being exposed in locations where the first plurality of trenches 408 and the second plurality of trenches 418 intersect. However, the blocking material 410 blocks or prevents the exposed portions of the first plurality of trenches 408 from being further etched during the second etch operation, which reduces and/or prevents etch loading and/or over etching at and/or near the intersections of the first plurality of trenches 408 and the second plurality of trenches 418.

FIG. 4L illustrates another top-down view of the pixel array 300 and another cross-sectional view along the line BB. As shown in FIG. 4L the remaining portions of the second photoresist layer 414 and the remaining portions of the second ARC 412 may be removed from the substrate 304. Various techniques may be used to remove the remaining portions of the second photoresist layer 414 and the remaining portions of the second ARC 412, such as selective etching, ashing (e.g., plasma ashing), and/or photoresist stripping, among other examples. Moreover, the blocking material 410 may be removed from the first plurality of trenches 408 using similar techniques. In some implementations, the blocking material 410 may be removed in the same operation as the removal of the second ARC 412 and/or the second photoresist layer 414. In some implementations, the blocking material 410 may be removed in separate operations to the removal of the second ARC 412 and/or the second photoresist layer 414.

The formation of the second plurality of trenches 418 may result in the formation of a grid of intersecting trenches, as shown in the top-down view in FIG. 4L. Since the first direction of the first plurality of trenches 408 and the second direction of the second plurality of trenches 418 are approximately perpendicular, the first plurality of trenches 408 and the second plurality of trenches 418 may form a plurality of approximate right-angle (or orthogonal) intersections in a plurality of locations 420 in the substrate 304.

As shown in the cross-sectional view in FIG. 4M, the first plurality of trenches 408 and the second plurality of trenches 418 may be filled with oxide material and/or another type of dielectric material to form the DTI structure 308. The deposition tool 102 may deposit the oxide material in the first plurality of trenches 408 and the second plurality of trenches 418 using various PVD techniques, CVD techniques and/or ALD techniques, such as sputtering, PECVD, HDP-CVD, SACVD, and/or PEALD, among other examples. In some implementations, the planarization tool 110 planarizes the oxide material after the oxide material is deposited.

As shown in the cross-sectional view in FIG. 4N, the ARC 310 may be formed over and/or on the substrate 304, over and/or on the photodiodes 306, and over and/or on the DTI structure 308. The deposition tool 102 may deposit the ARC 310 using a CVD technique, a PVD technique, an ALD technique, or another type of deposition technique described above in connection with FIG. 1. The planarization tool 110 may planarize the ARC 310 after the ARC 310 is deposited.

As shown in the cross-sectional view in FIG. 4O, the dielectric layer 312 may be formed over and/or on the ARC 310. The deposition tool 102 may deposit the dielectric layer 312 using a CVD technique, a PVD technique, an ALD technique, or another type of deposition technique described above in connection with FIG. 1. The planarization tool 110 may planarize the dielectric layer 312 after the dielectric layer 312 is deposited.

As further shown in the cross-sectional view in FIG. 4O, the metal layer 314 may be formed over and/or on the dielectric layer 312. The deposition tool 102 may deposit the material of the metal layer 314 using a CVD technique, a PVD technique, an ALD technique, or another type of deposition technique, the plating tool 112 may deposit the material of the metal layer 314 using an electroplating operation, or a combination thereof. The planarization tool 110 may planarize the metal layer 314 after the metal layer 314 is deposited.

As shown in the cross-sectional view in FIG. 4P, portions of the metal layer 314 and portions of the dielectric layer 312 may be removed to form openings 422 through the metal layer 314 and through the dielectric layer 312. The remaining portions of the metal layer 314 and portions of the dielectric layer 312 may form the grid structure 316. The openings 422 may be formed by coating the metal layer 314 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching through the metal layer 314 and into a portion of and/or through the dielectric layer 312 (e.g., using the etch tool 108) based on the pattern in the photoresist.

As shown in the cross-sectional view in FIG. 4Q, respective color filter regions 318 may be formed for each of the pixel sensors 302 in the pixel array 300 in the openings 422 in between the grid structure 316. For example, the color filter region 318a may be formed in an opening 422 above the photodiode 306 for the pixel sensor 302a, a color filter region 318b may be formed in an opening 422 above the photodiode 306 for the pixel sensor 302b, a color filter region 318c may be formed in an opening 422 above the photodiode 306 for the pixel sensor 302c, and so on. Each color filter region 318 may be formed in between the grid structure 316 to reduce color mixing between adjacent pixel sensors 302. A semiconductor processing tool (e.g., the deposition tool 102) may deposit the color filter regions 318 using various PVD techniques, CVD techniques and/or ALD techniques, such as sputtering, PECVD, HDP-CVD, SACVD, or PEALD.

As shown in the cross-sectional view in FIG. 4R, the micro-lens layer 320 including a plurality of micro-lenses is formed over and/or on the color filter regions 318 and over and/or on the grid structure 316. The micro-lens layer 320 may include a respective micro-lens for each of the pixel sensors 302 included in the pixel array 300. For example, a micro-lens may be formed over and/or on the color filter region 318a of the pixel sensor 302a, a micro-lens may be formed over and/or on the color filter region 318b of the pixel sensor 302b, a micro-lens may be formed over and/or on the color filter region 318c of the pixel sensor 302c, and so on.

As indicated above, FIGS. 4A-4R are provided as an example. Other examples may differ from what is described with regard to FIGS. 4A-4R.

Figure 5A:
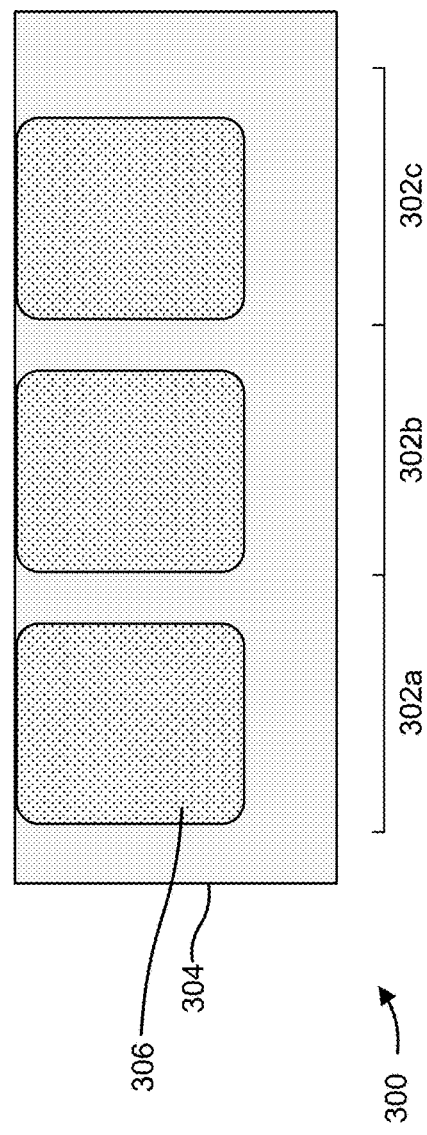
Figure 5B:
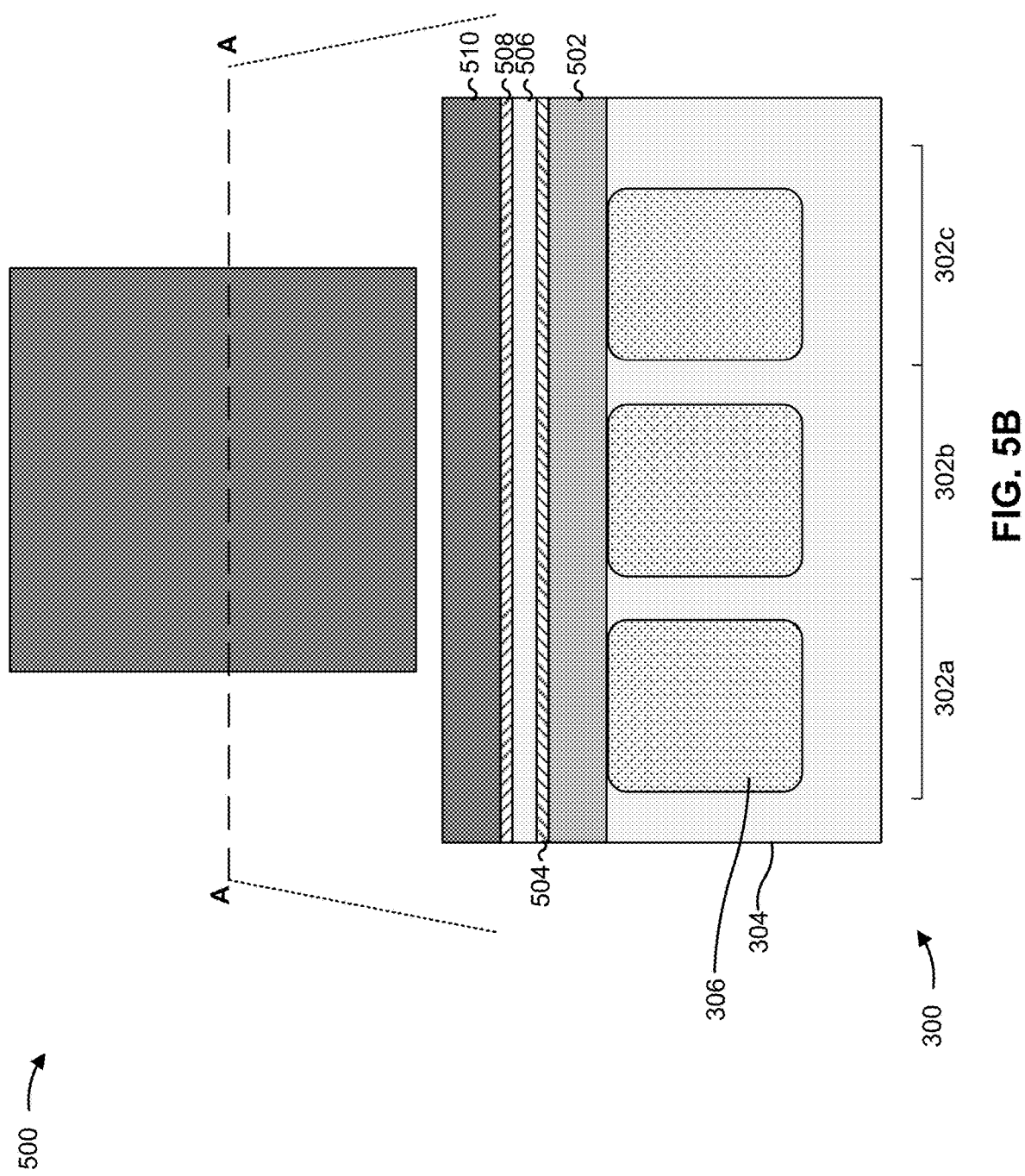
Figure 5C:
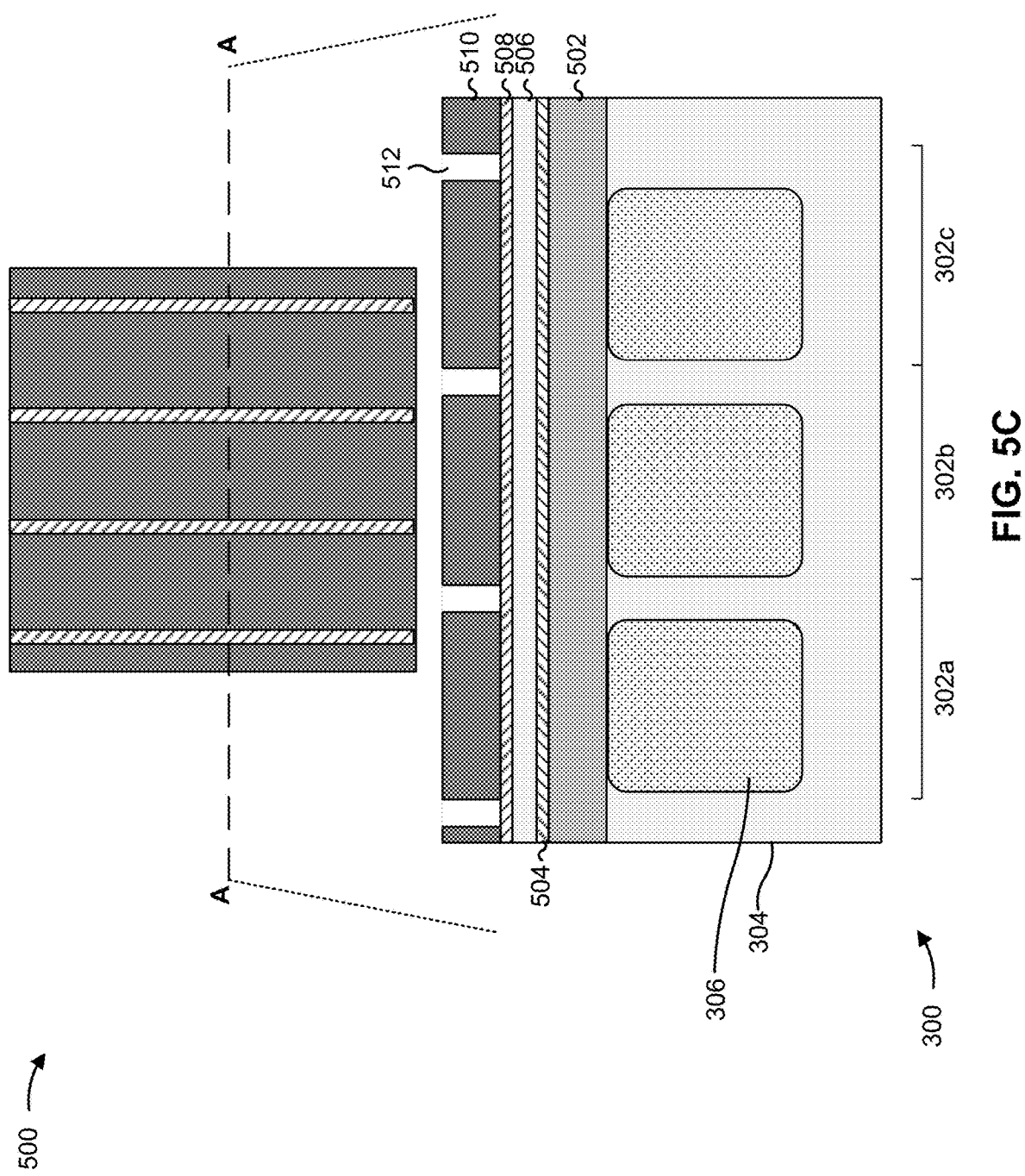
Figure 5D:
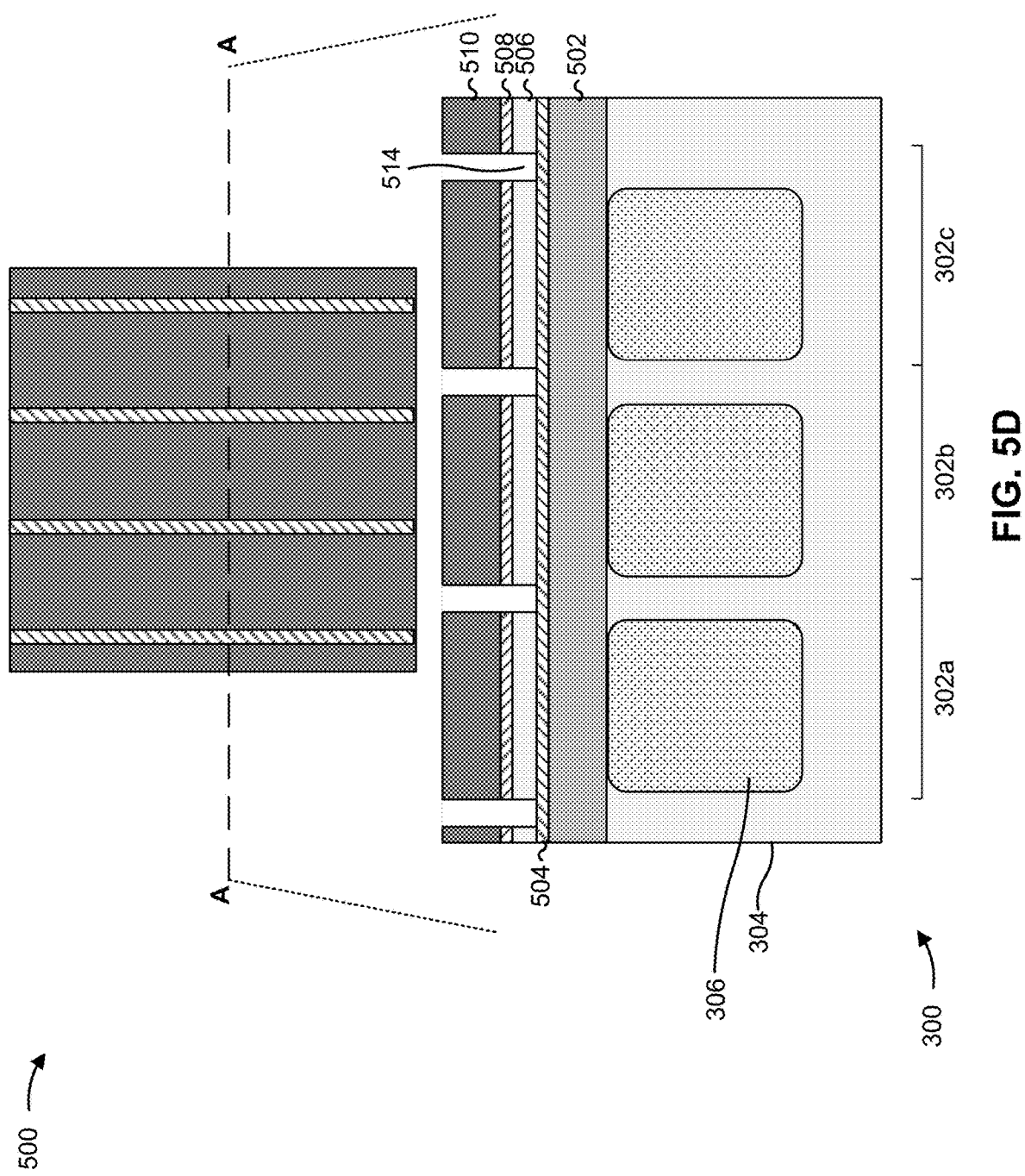
Figure 5E:
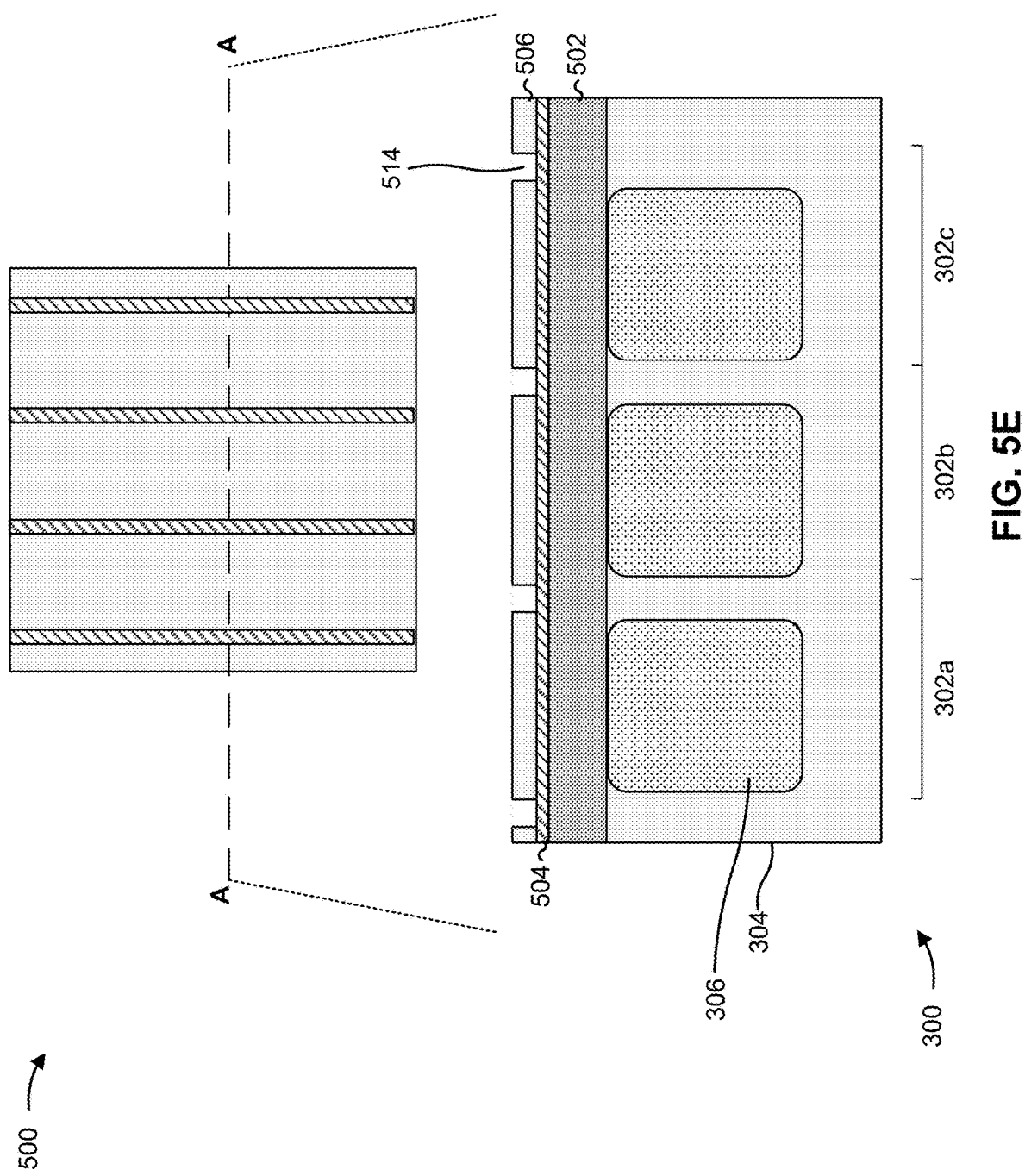
Figure 5G:
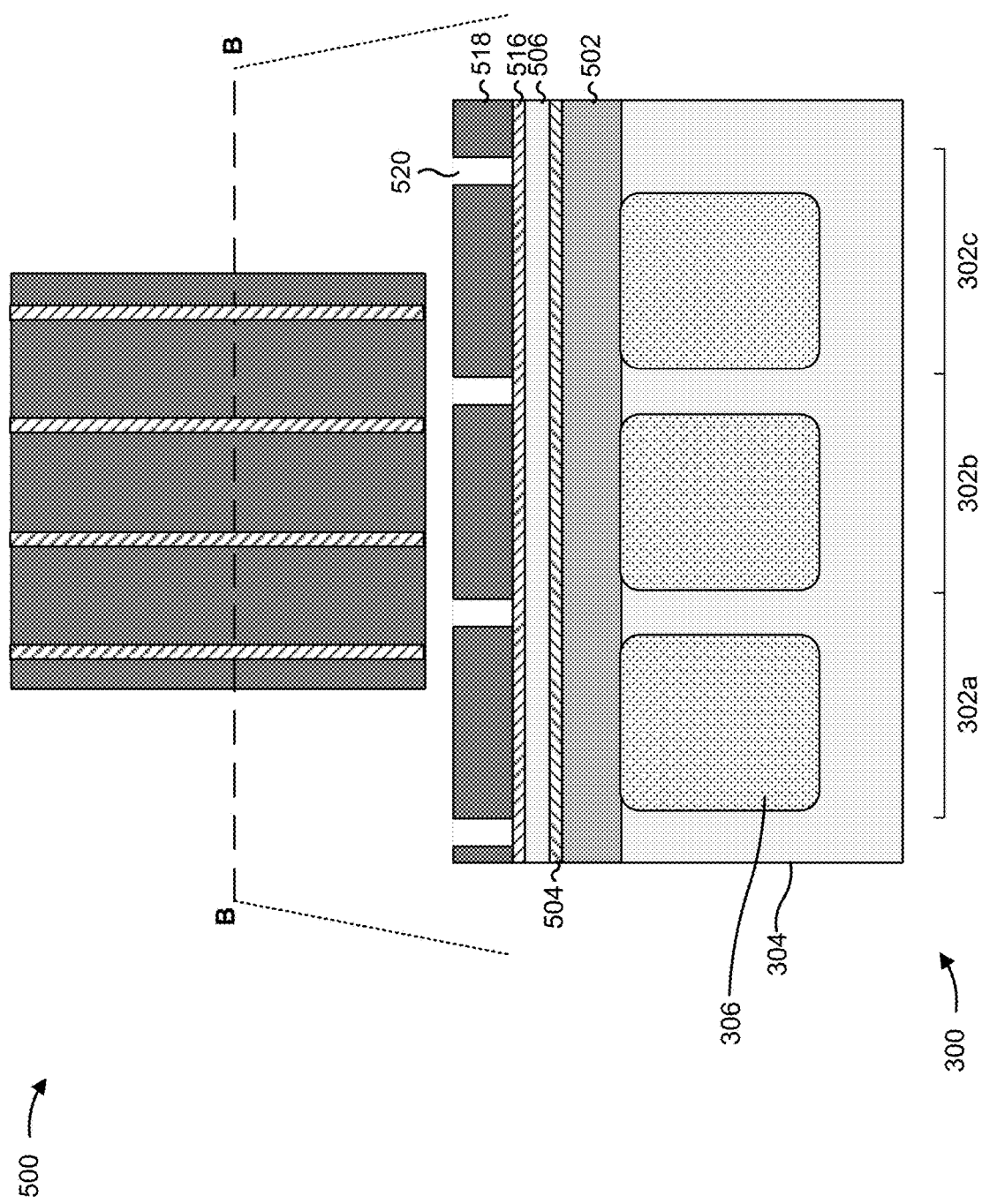
Figure 5H:
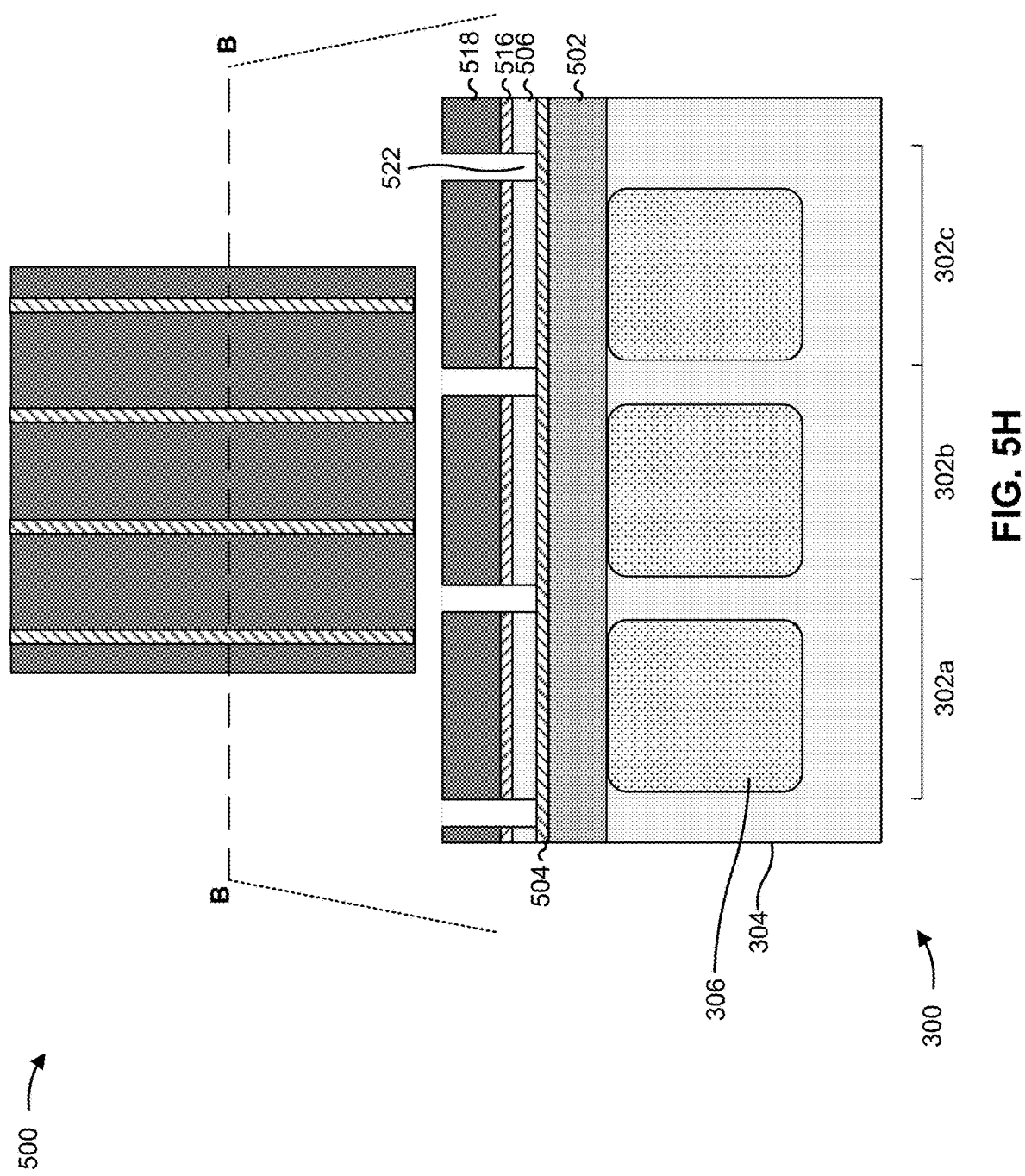
Figure 5I:
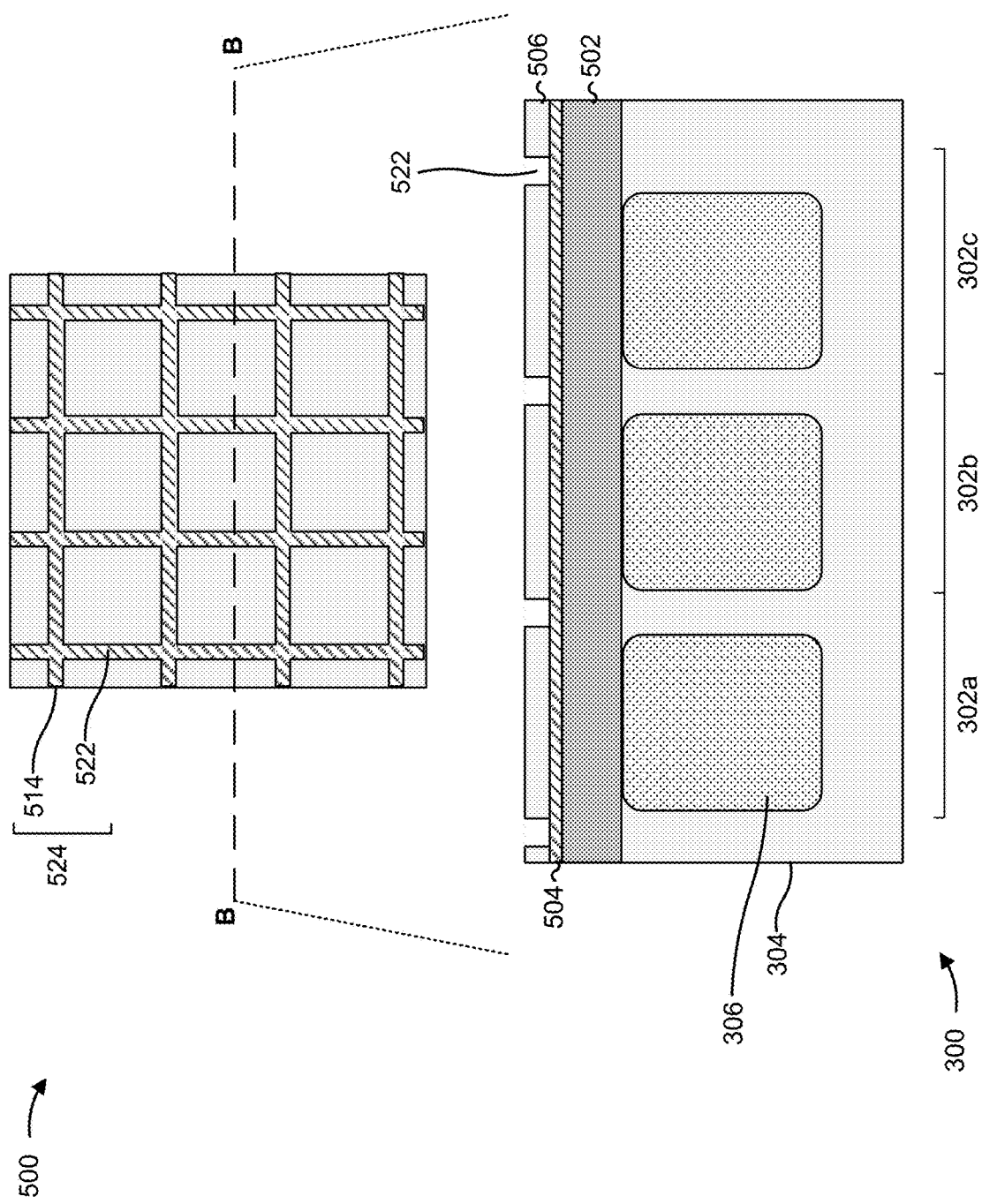
Figure 5J:
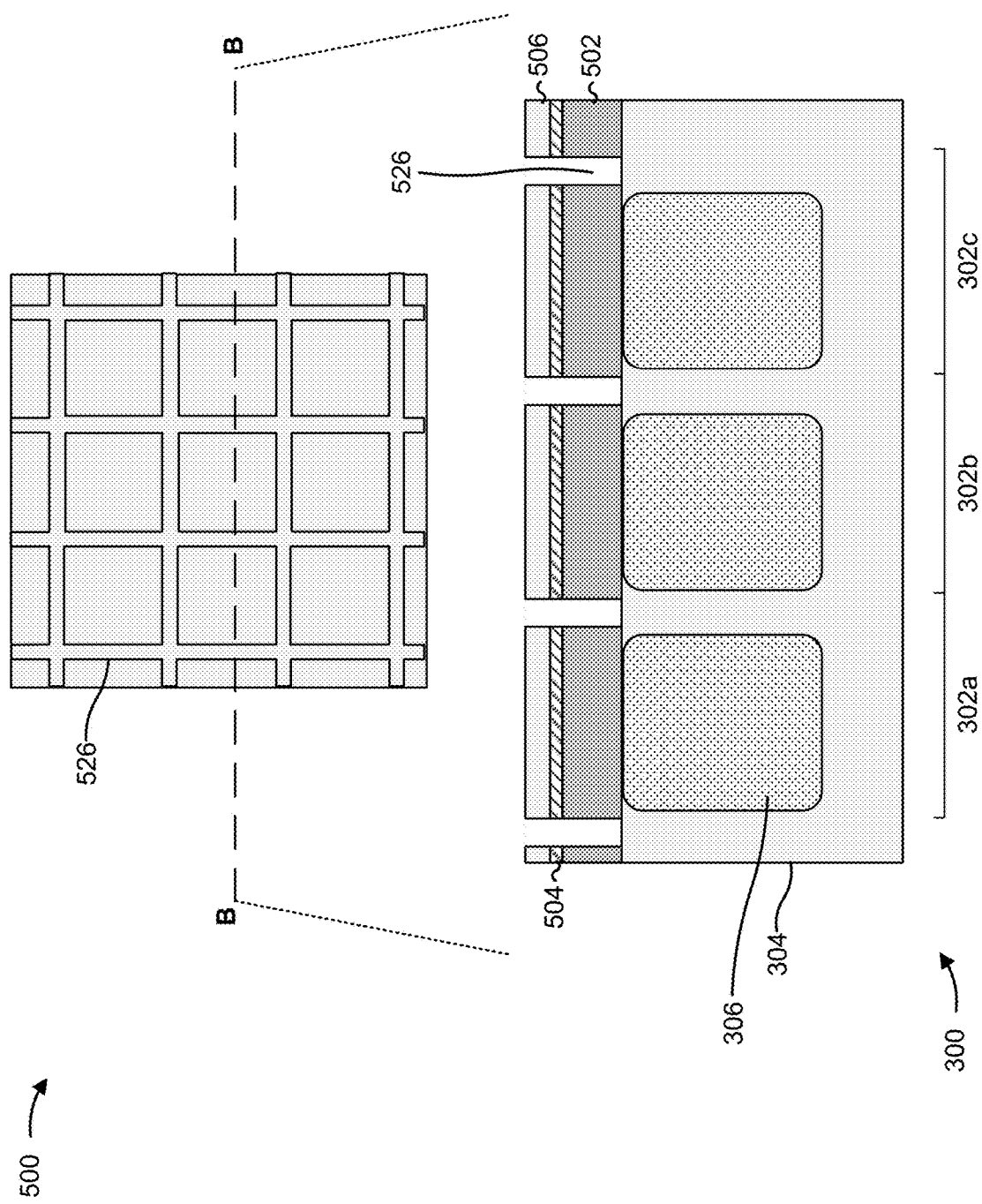
Figure 5K:
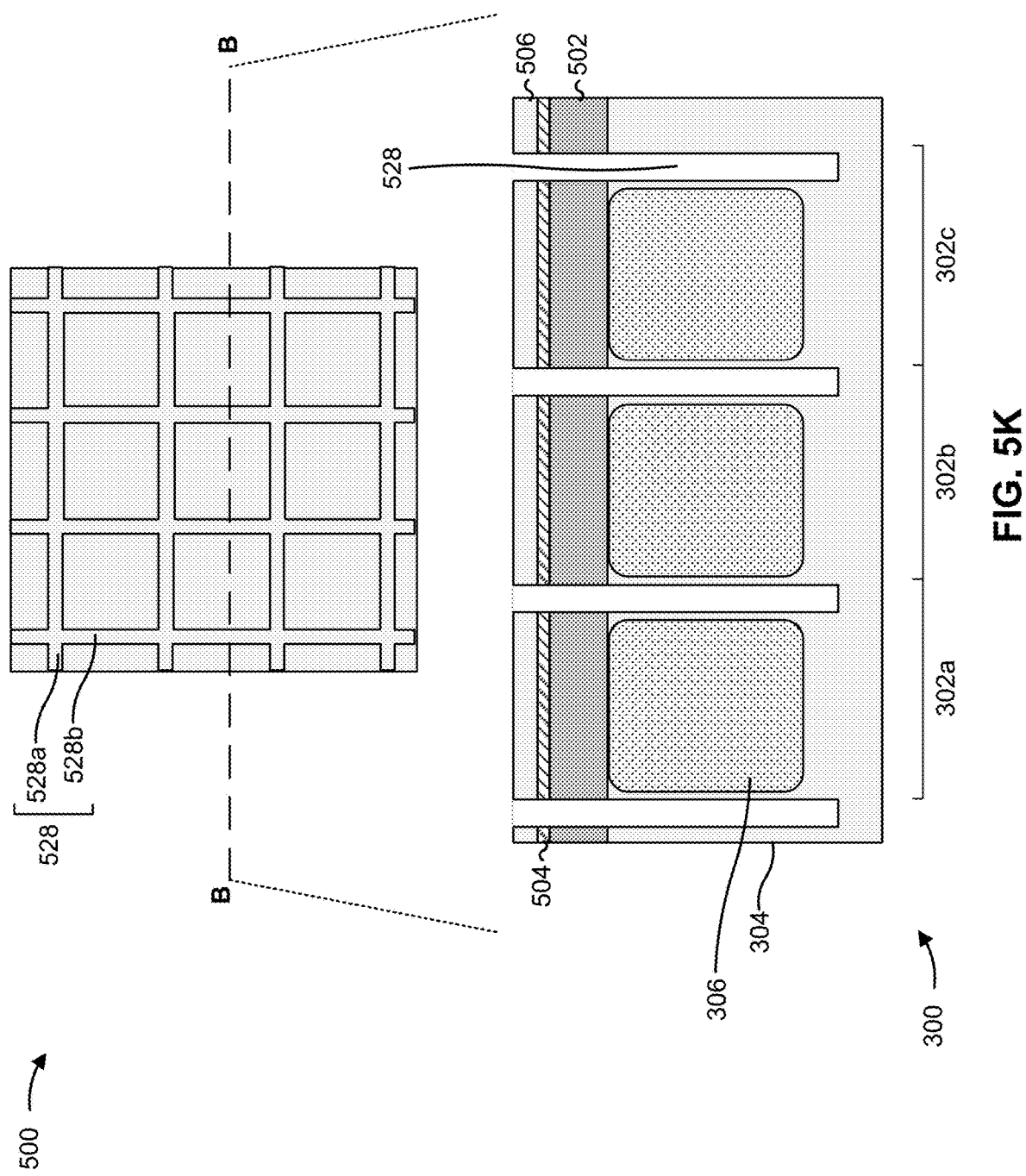
Figure 5M:
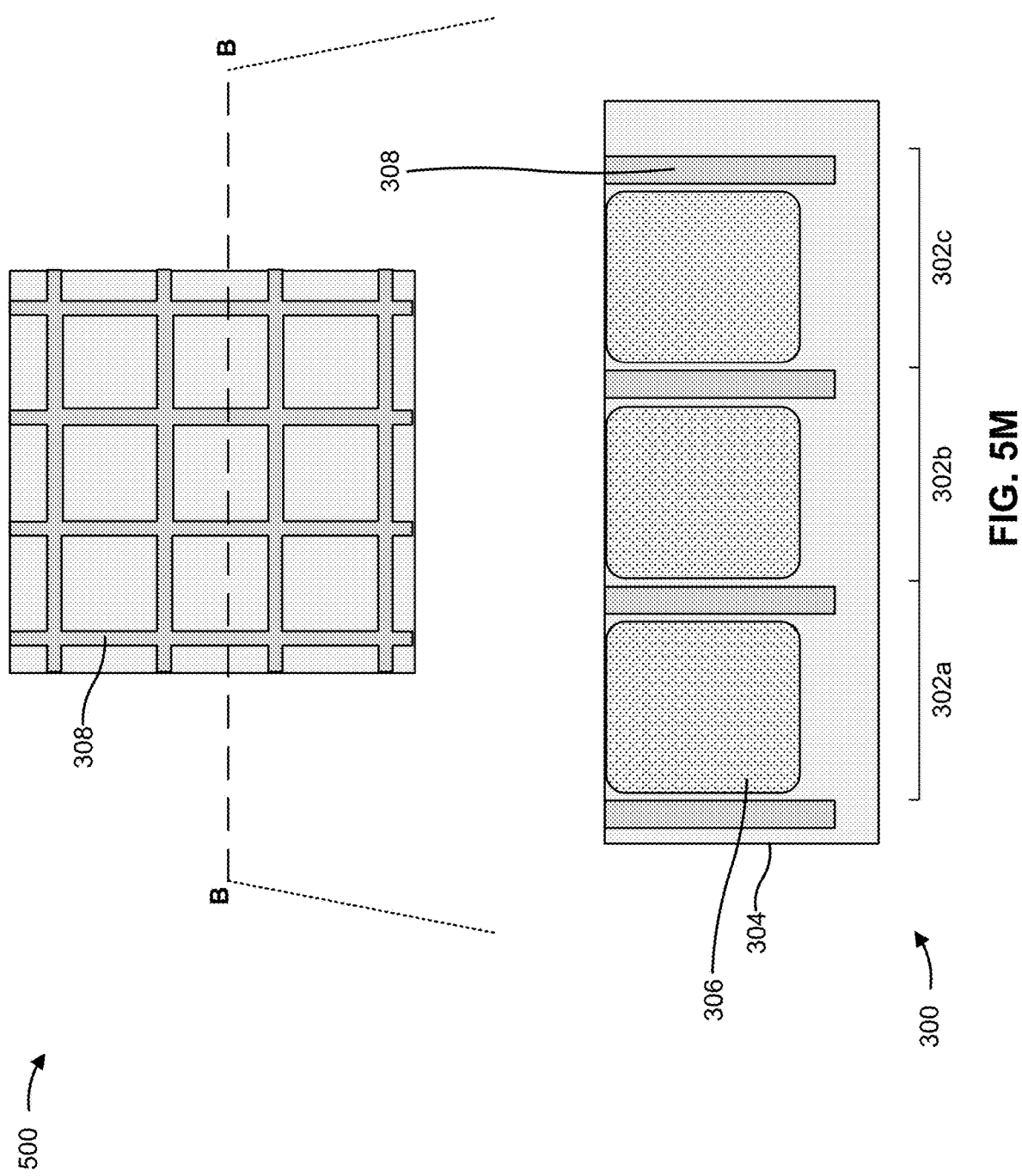
Figure 5N:
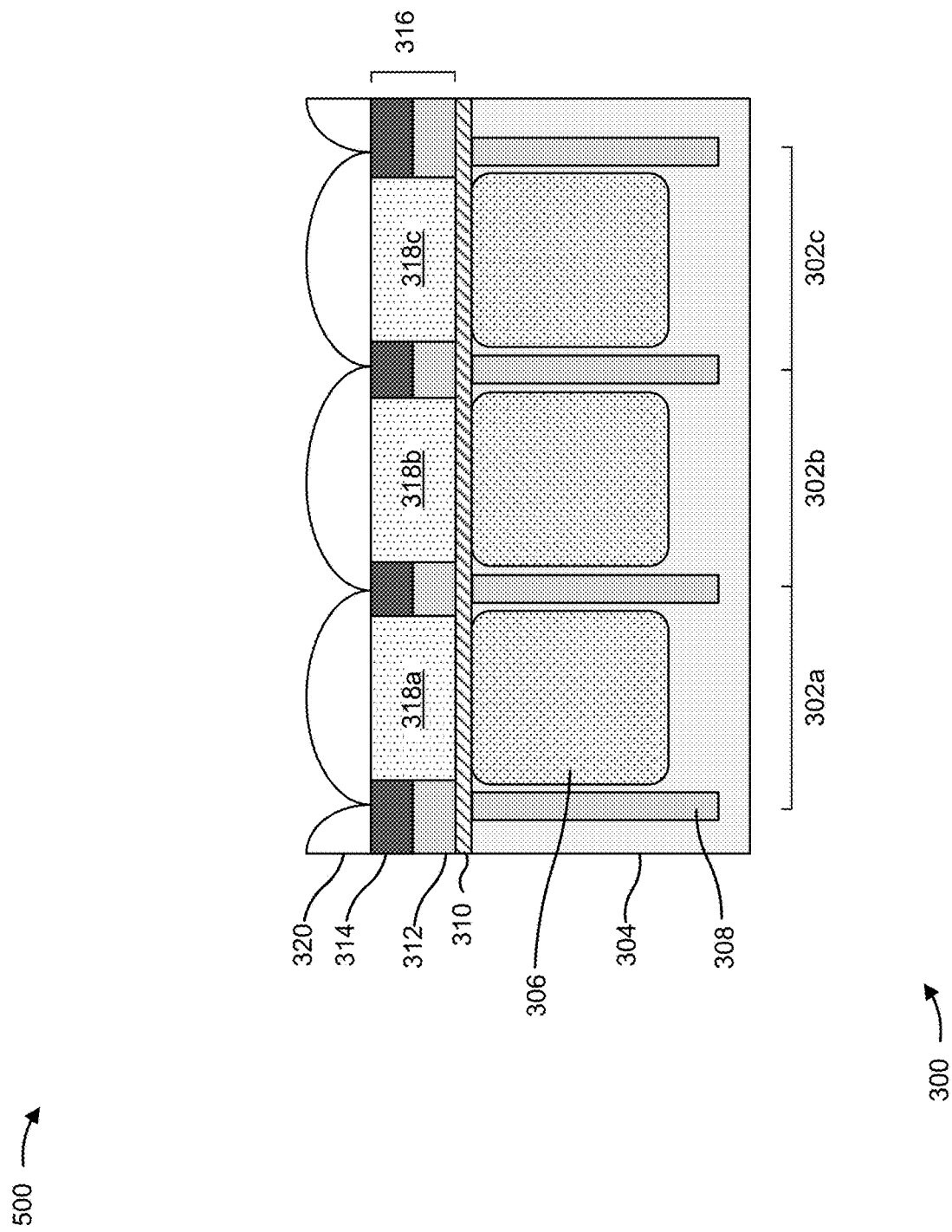

FIGS. 5A-5N are diagrams of an example implementation 500 described herein. The example implementation 500 may include another example process or method for forming the pixel array 300. Moreover, the example implementation 500 may include another double patterning technique for forming the DTI structure 308 of the pixel array 300. The double patterning technique described in connection with FIGS. 5A-5N may differ from the double patterning technique described in connection with FIGS. 4A-4R in that the double patterning technique described in connection with FIGS. 5A-5N includes the use of a hard mask layer. A plurality of portions of a pattern, that is to be used to etch the trenches for the DTI structure 308 into the substrate 304, may be formed in the hard mask layer in a plurality of patterning operations to increase the sharpness and resolution of the pattern (e.g., relative to forming the pattern in the hard mask layer in a single patterning operation).

The double patterning technique described in connection with FIGS. 5A-5N may reduce and/or prevent corner rounding and etch loading at and/or near intersections of the trenches of the DTI structure 308. Accordingly, the double patterning technique described in connection with FIGS. 5A-5N may increase the sharpness of the trenches and may increase depth uniformity of the trenches. Moreover, the double patterning technique described in connection with FIGS. 5A-5N may be used to form DTI structures of ultra-high aspect ratios and/or may enable the reduction of pixel sensor sizes (or pixel sensor pitches) to sub-micron sizes.

As shown in the cross-sectional view in FIG. 5A, the pixel sensors 302 (e.g., the pixel sensor 302a, the pixel sensor 302b, the pixel sensor 302c, and so on) may be formed in the substrate 304. The substrate 304 may include a silicon substrate, a substrate formed of a material including silicon, a III-V compound semiconductor substrate such as gallium arsenide (GaAs) substrate, a silicon on insulator (SOI) substrate, or another type of substrate is capable of generating a charge from photons of incident light.

As further shown in the cross-sectional view in FIG. 5A, one or more semiconductor processing tools may form a plurality of photodiodes 306 in the substrate 304. For example, the ion implantation tool 114 may dope the portions of the substrate 304 in between the trenches of the DTI structure 308 using an ion implantation technique to form a respective photodiode 306 for a plurality of pixel sensors 302 (e.g., pixel sensors 302a-302c). The substrate 304 may be doped with a plurality of types of ions to form a p-n junction for each photodiode 306. For example, the substrate 304 may be doped with an n-type dopant to form a first portion (e.g., an n-type portion) of a photodiode 306 and a p-type dopant to form a second portion (e.g., a p-type portion) of the photodiode 306. In some implementations, another technique is used to form the photodiodes 306 such as diffusion.

FIG. 5B illustrates a top-down view of the pixel array 300 and a cross-sectional view along the line AA. As shown in FIG. 5B, one or more layers may be formed over and/or on the substrate 304 in preparation for a first patterning operation, such as an ashing removable dielectric (ARD) layer 502, a plasma enhanced oxide (PEOX) layer 504, a hard mask layer 506, a first ARC 508, and a first photoresist layer 510. In some implementations, additional layers are formed over and/or on the substrate, such as a buffer (or pad) oxide layer. The deposition tool 102 may form the ARD layer 502 over and/or on the substrate 304, may form the PEOX layer 504 over and/or on the ARD layer 502, may form the hard mask layer 506 over and/or on the PEOX layer 504, may form the first ARC 508 over and/or on the hard mask layer 506, and may form the first photoresist layer 510 over and/or on the first ARC 508. The deposition tool 102 may deposit the ARD layer 502, the PEOX layer 504, the hard mask layer 506, the first ARC 508, and/or the first photoresist layer 510 using spin coating, various PVD techniques, CVD techniques and/or ALD techniques, such as sputtering, PECVD, HDP-CVD, SACVD, and/or PEALD, among other examples.

The ARD layer 502 may include a dielectric material that is more sensitive to ashing (e.g., oxygen-based ashing, nitrogen-based ashing, hydrogen-based ashing) relative to other dielectric materials, such as a carbon-based dielectric material and/or another type of dielectric material. The PEOX layer 504 may include a plasma enhanced oxide material including a silicon oxide ($SiO_x$) (e.g., silicon dioxide ($SiO_2$)), a hafnium oxide ($HfO_x$), a hafnium silicon oxide ($HfSiO_x$), an aluminum oxide ($Al_xO_y$), and/or another oxide material. The hard mask layer 506 may include a silicon oxynitride (SiON), a silicon carbide (SiC), a silicon oxycarbide (SiOC), and/or another hard mask material.

The deposition tool 102 may form the ARD layer 502 to a thickness of approximately 2000 angstroms to approximately 8000 angstroms based on one or more etching parameters for etching trenches into the substrate 304 such as a target depth and/or a target width of the trenches. However, other values for the thickness of the ARD layer 502 are within the scope of the present disclosure. The deposition tool 102 may deposit the PEOX layer 504 using various PVD techniques, CVD techniques and/or ALD techniques, such as sputtering, PECVD, HDP-CVD, SACVD, and/or PEALD, among other examples. The deposition tool 102 may form the PEOX layer 504 to a thickness of approximately 100 angstroms to approximately 300 angstroms based on one or more etching parameters for etching trenches into the substrate 304 such as a target depth and/or a target width of the trenches. However, other values for the thickness of the PEOX layer 504 are within the scope of the present disclosure. The deposition tool 102 may form the hard mask layer 506 to a thickness of approximately 200 angstroms to approximately 600 angstroms based on one or more etching parameters for etching trenches into the substrate 304 such as a target depth and/or a target width of the trenches. However, other values for the thickness of the hard mask layer 506 are within the scope of the present disclosure.

The deposition tool 102 may form the first ARC 508 to a thickness of approximately 600 angstroms to approximately 800 angstroms based on one or more etching parameters for etching a first portion of a pattern into the hard mask layer 506 such as a target depth and/or a target width of the first portion of the pattern. However, other values for the thickness of the first ARC 508 are within the scope of the present disclosure. The deposition tool 102 may form the first photoresist layer 510 a thickness of approximately 1000 angstroms to approximately 3000 angstroms based on one or more etching parameters for etching the first portion of the pattern into the hard mask layer 506 such as a target depth and/or a target width of the first portion of the pattern. However, other values for the thickness of the first photoresist layer 510 are within the scope of the present disclosure.

FIG. 5C illustrates another top-down view of the pixel array 300 and another cross-sectional view along the line AA. As shown in FIG. 5C, a first photoresist pattern 512 may be formed in the first photoresist layer 510 by removing a plurality of portions of the first photoresist layer 510. The first photoresist pattern 512 may be used to form a first portion of a hard mask pattern in the hard mask layer 506. The first photoresist pattern 512 may be formed by exposing the first photoresist layer 510 to a radiation source (e.g., using the exposure tool 104) and removing either the exposed portions or the non-exposed portions of the first photoresist layer 510 (e.g., using developer tool 106). In this way, the first photoresist pattern 512 is formed through the first photoresist layer 510 (e.g., from a top surface of the first photoresist layer 510 through the first photoresist layer 510 to the bottom surface of the first photoresist layer 510) to the first ARC 508.

FIG. 5D illustrates another top-down view of the pixel array 300 and another cross-sectional view along the line AA. As shown in FIG. 5D, a first portion 514 of a hard mask pattern may be formed in and through the hard mask layer 506. In particular, the etch tool 108 may etch through the first ARC 508 and through the hard mask layer 506 to the PEOX layer 504 to form the first portion 514 of the hard mask pattern based on the first photoresist pattern 512 in the first photoresist layer 510. The etch tool 108 may perform a first etch operation to form or etch the first portion 514 of the hard mask pattern in a first direction in the hard mask layer 506 (e.g., in which the openings of the first portion 514 of the hard mask pattern may be approximately parallel and extend in the first direction), as shown in the example in FIG. 5D.

FIG. 5E illustrates another top-down view of the pixel array 300 and another cross-sectional view along the line AA. As shown in FIG. 5E, the remaining portions of the first photoresist layer 510 and the remaining portions of the first ARC 508 may be removed from the hard mask layer 506. Various techniques may be used to remove the remaining portions of the first photoresist layer 510 and the remaining portions of the first ARC 508, such as selective etching, ashing (e.g., plasma ashing), and/or photoresist stripping, among other examples.

FIG. 5F illustrates another top-down view of the pixel array 300 and a cross-sectional view along the line BB. As shown in FIG. 5F, the cross-sectional view along the line BB may include a cross section of the pixel array 300 that is approximately 90 degrees relative to the cross-sectional views along the line AA.

As further shown in FIG. 5F, one or more layers may be formed over and/or on the hard mask layer 506 in preparation for a second patterning operation, such as a second ARC 516 and a second photoresist layer 518. The second photoresist layer 518 may be used as a lithography patterning layer in which a pattern is transferred to the second photoresist layer 518 in an exposure operation. The second photoresist layer 518 may be patterned in preparation for etching a second portion of the hard mask pattern into the hard mask layer 506. The second ARC 516 may be provided to improve the lithography patterning performance of the second photoresist layer 518. The second ARC 516 and the second photoresist layer 518 may be formed after removal of the first ARC 508 and the first photoresist layer 510. The second ARC 516 and the second photoresist layer 518 may be similar to the first ARC 508 and the first photoresist layer 510, respectively, and may be formed by similar deposition techniques.

FIG. 5G illustrates another top-down view of the pixel array 300 and another cross-sectional view along the line BB. As shown in FIG. 5G, a second photoresist pattern 520 may be formed in the second photoresist layer 518 by removing a plurality of portions of the second photoresist layer 518. The second photoresist pattern 520 may be formed by exposing the second photoresist layer 518 to a radiation source (e.g., using the exposure tool 104) and removing either the exposed portions or the non-exposed portions of the second photoresist layer 518 (e.g., using developer tool 106). In this way, the second photoresist pattern 520 is formed through the second photoresist layer 518 (e.g., from a top surface of the second photoresist layer 518 through the second photoresist layer 518 to the bottom surface of the second photoresist layer 518) to the second ARC 516.

FIG. 5H illustrates another top-down view of the pixel array 300 and another cross-sectional view along the line BB. As shown in FIG. 5H, a second portion 522 of the hard mask pattern in the hard mask layer 506 may be formed into and through the hard mask layer 506. In particular, the etch tool 108 may perform a second etch operation, which may be separate from and subsequent to the first etch operation described above in connection with FIG. 5D, to etch through the second ARC 516 and through the hard mask layer 506 to the PEOX layer 504 to form the second portion 522 of the hard mask pattern based on the second photoresist pattern 520 in the second photoresist layer 518. The etch tool 108 may form or etch the second portion 522 of the hard mask pattern in a second direction in the hard mask layer 506 (e.g., in which the openings of the second portion 522 of the hard mask pattern may be approximately parallel and extend in the second direction), as shown in the example in FIG. 5H. The second direction may be approximately perpendicular to the first direction of the first portion 514 of the hard mask pattern.

FIG. 5I illustrates another top-down view of the pixel array 300 and another cross-sectional view along the line BB. As shown in FIG. 5I the remaining portions of the second photoresist layer 518 and the remaining portions of the second ARC 516 may be removed from the hard mask layer 506. Various techniques may be used to remove the remaining portions of the second photoresist layer 518 and the remaining portions of the second ARC 516, such as selective etching, ashing (e.g., plasma ashing), and/or photoresist stripping, among other examples.

As further shown in FIG. 5I the first portion 514 and the second portion 522 may form the hard mask pattern 524 in the hard mask layer 506. The first portion 514 and the second portion 522 may form a grid of intersecting openings, as shown in the top-down view in FIG. 5I. Since the first direction of the first portion 514 and the second direction of the second portion 522 are approximately perpendicular, the first portion 514 and the second portion 522 may form a plurality of approximate right-angle (or orthogonal) intersections in a plurality of locations in the hard mask layer 506.

FIG. 5J illustrates another top-down view of the pixel array 300 and another cross-sectional view along the line BB. As shown in FIG. 5J, a plurality of openings 526 may be formed into and through the PEOX layer 504 and into and through the ARD layer 502. In particular, the etch tool 108 may perform a third etch operation, which may be separate from and subsequent to the first etch operation and the second etch operation, to etch through the PEOX layer 504 and through the ARD layer 502 to form the openings 526 based on the hard mask pattern 524 in the hard mask layer 506.

FIG. 5K illustrates another top-down view of the pixel array 300 and another cross-sectional view along the line BB. As shown in FIG. 5K, a plurality of intersecting trenches 528 may be formed into a portion of the substrate 304. In particular, the etch tool 108 may perform a fourth etch operation to etch into a portion of the substrate 304 (e.g., from a top surface of the substrate 304) to form the plurality of trenches 528 based on the hard mask pattern 524 in the hard mask layer 506 and based on the openings 526 in the ARD layer 502. In some implementations, the third etch operation to form the plurality of openings 526 and the fourth etch operation to form the plurality of trenches 528 may be performed as parts of the same etch operation. In some implementations, the third etch operation to form the plurality of openings 526 and the fourth etch operation to form the plurality of trenches 528 may be performed in separate etch operations. The plurality of intersecting trenches 528 may be formed in between the photodiodes 306, as shown in the example in FIG. 5K.

As further shown in FIG. 5K, the plurality of trenches 528 may include a first plurality of trenches 528a that extend in the first direction of the first portion 514 of the hard mask pattern 524, and a second plurality of trenches 528b that extend in the second direction of the second portion 522 of the hard mask pattern 524. The first plurality of trenches 528a and the second plurality of trenches 528b may intersect at various locations in the substrate 304.

FIG. 5L illustrates another top-down view of the pixel array 300 and another cross-sectional view along the line BB. As shown in FIG. 5I, the remaining portions of the ARD layer 502, the remaining portions of the PEOX layer 504, and the remaining portions of the hard mask layer 506 may be removed from the substrate 304. Various techniques may be used to remove the remaining portions of the ARD layer 502, the remaining portions of the PEOX layer 504, and the remaining portions of the hard mask layer 506, such as selective etching, ashing (e.g., plasma ashing), and/or photoresist stripping, among other examples.

FIG. 5M illustrates another top-down view of the pixel array 300 and another cross-sectional view along the line BB. As shown in the cross-sectional view in FIG. 5M, the plurality of trenches 528 may be filled with an oxide material and/or another type of dielectric material to form the DTI structure 308. The deposition tool 102 may deposit the oxide material in the plurality of trenches 528 using various PVD techniques, CVD techniques and/or ALD techniques, such as sputtering, PECVD, HDP-CVD, SACVD, and/or PEALD, among other examples. In some implementations, the planarization tool 110 planarizes the oxide material after the oxide material is deposited.

As shown in the cross-sectional view in FIG. 5N, one or more semiconductor processing tools may perform one or more semiconductor processing operations to form additional elements (e.g., structures, layers, and/or components) of the pixel array 300 as described above in connection with FIGS. 4M-4R. For example, one or more of the semiconductor processing tools 102-114 may form the elements 306 and 310-320 of the pixel array 300 as described above in connection with FIGS. 4M-4R.

As indicated above, FIGS. 5A-5N are provided as an example. Other examples may differ from what is described with regard to FIGS. 5A-5N.

Figure 6:
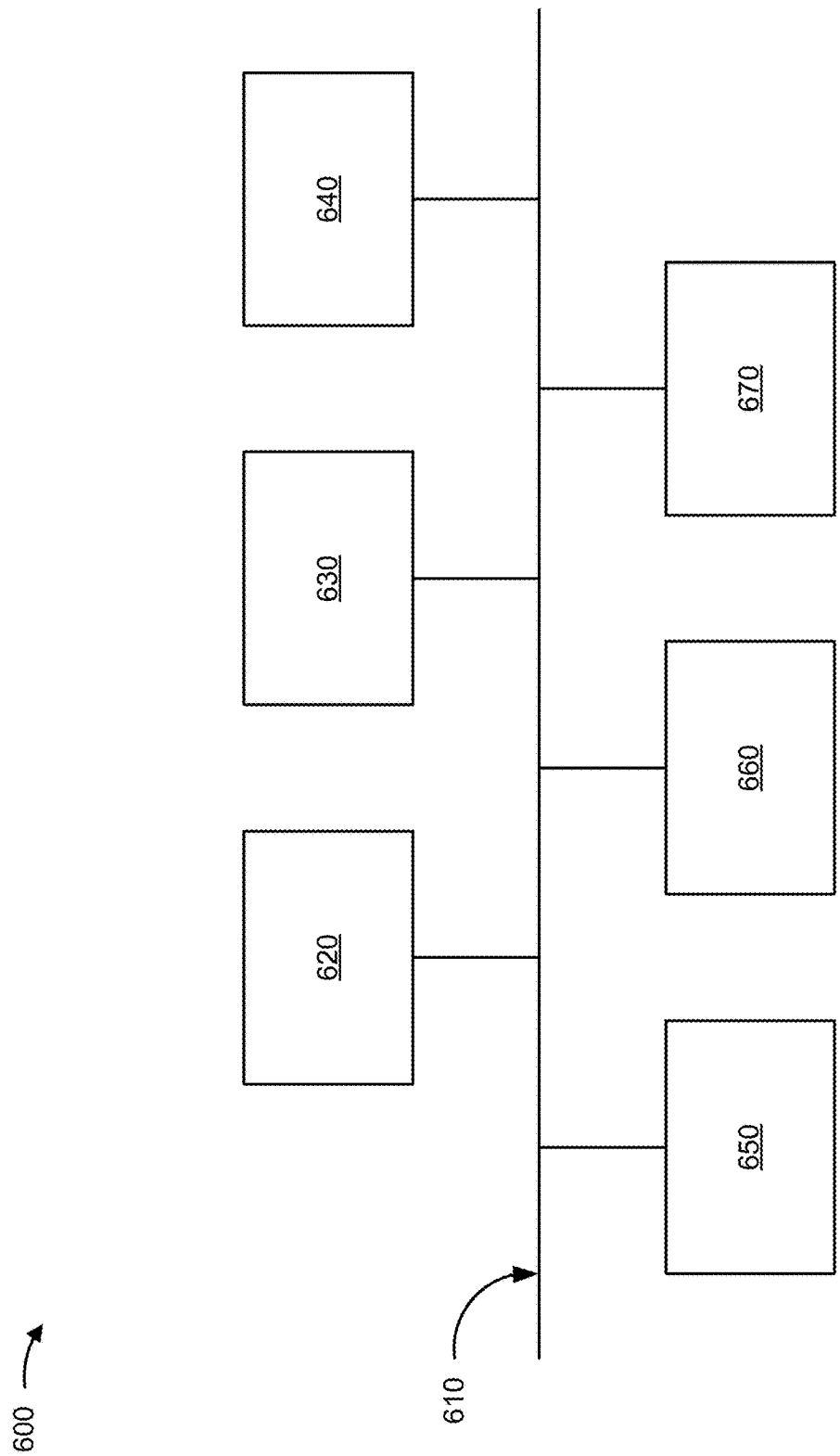
FIG. 6 is a diagram of example components of one or more devices of FIG. 1.

FIG. 6 is a diagram of example components of a device 600. In some implementations, one or more of the semiconductor processing tools 102-114 and/or the wafer/die transport tool 116 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
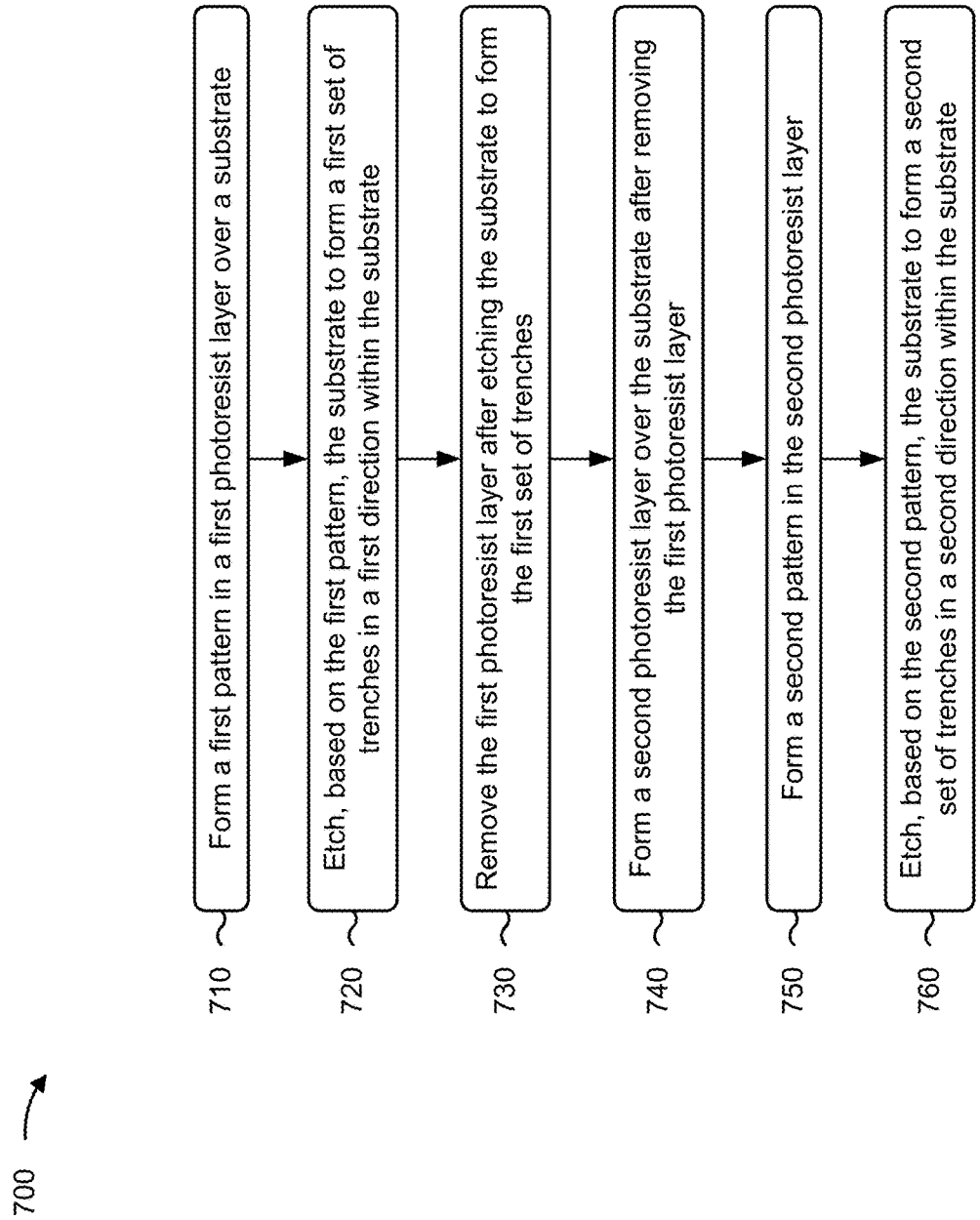
FIGS. 7-9 are flowcharts of example processes relating to forming a deep trench isolation (DTI) structure.

FIG. 7 is a flowchart of an example process 700 associated with forming a DTI structure. In some implementations, one or more process blocks of FIG. 7 may be performed by one or more semiconductor processing tools (e.g., one or more of the semiconductor processing tools 102-114). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a first pattern in a first photoresist layer over a substrate (block 710). For example, one or more of the semiconductor processing tools 102-114 may form the first pattern 406 in the first photoresist layer 404 over the substrate 304, as described above.

As further shown in FIG. 7, process 700 may include etching, based on the first pattern, the substrate to form a first set of trenches in a first direction within the substrate (block 720). For example, one or more of the semiconductor processing tools 102-114 may etch, based on the first pattern 406, the substrate 304 to form the first set of trenches 408 in a first direction within the substrate 304, as described above.

As further shown in FIG. 7, process 700 may include removing the first photoresist layer after etching the substrate to form the first set of trenches (block 730). For example, one or more of the semiconductor processing tools 102-114 may remove the first photoresist layer 404 after etching the substrate 304 to form the first set of trenches 408, as described above.

As further shown in FIG. 7, process 700 may include forming a second photoresist layer over the substrate after removing the first photoresist layer (block 740). For example, one or more of the semiconductor processing tools 102-114 may form the second photoresist layer 414 over the substrate 304 after removing the first photoresist layer 404, as described above.

As further shown in FIG. 7, process 700 may include forming a second pattern in the second photoresist layer (block 750). For example, one or more of the semiconductor processing tools 102-114 may form the second pattern 416 in the second photoresist layer 414, as described above.

As further shown in FIG. 7, process 700 may include etching, based on the second pattern, the substrate to form a second set of trenches in a second direction within the substrate (block 760). For example, one or more of the semiconductor processing tools 102-114 may etch, based on the second pattern 416, the substrate 304 to form the second set of trenches 418 in a second direction within the substrate 304, as described above.

Process 700 may include additional implementations, such as any single implementation or any combination of implementations described below and/or in connection with one or more other processes described elsewhere herein.

In a first implementation, process 700 includes filling the first set of trenches 408 and the second set of trenches 418 to form a DTI structure (e.g., the DTI structure 204 and/or 308) of a pixel array (e.g., the pixel array 200 and/or 300). In a second implementation, alone or in combination with the first implementation, process 700 includes forming photodiodes 306 for pixel sensors (e.g., the pixel sensors 202 and/or 302) of the pixel array, where the first set of trenches and the second set of trenches are formed in between the photodiodes. In a third implementation, alone or in combination with one or more of the first and second implementations, process 700 includes forming the ARC 402 over the substrate 304, and forming the first photoresist layer 404 over the ARC 402. In a fourth implementation, alone or in combination with one or more of the first through third implementations, the first direction and the second direction are approximately perpendicular such that the first set of trenches 408 and the second set of trenches 418 intersect at a plurality of locations 420 in the substrate.

In a fifth implementation, alone or in combination with one or more of the first through fourth implementations, process 700 includes filling the first set of trenches 408 with the blocking material 410 prior to etching the substrate 304 to form the second set of trenches 418. In a sixth implementation, alone or in combination with one or more of the first through fifth implementations, process 700 includes removing the blocking material from the first set of trenches after etching the substrate to form the second set of trenches, and removing the second photoresist layer after etching the substrate to form the second set of trenches. In a seventh implementation, alone or in combination with one or more of the first through sixth implementations, a ratio between a depth (D) of the first set of trenches 408 and a width (W) of the first set of trenches 408 is in a range of approximately 20 to approximately 50, and a ratio between a depth (D) of the second set of trenches 418 and a width (W) of the second set of trenches 418 is in the range of approximately 20 to approximately 50.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
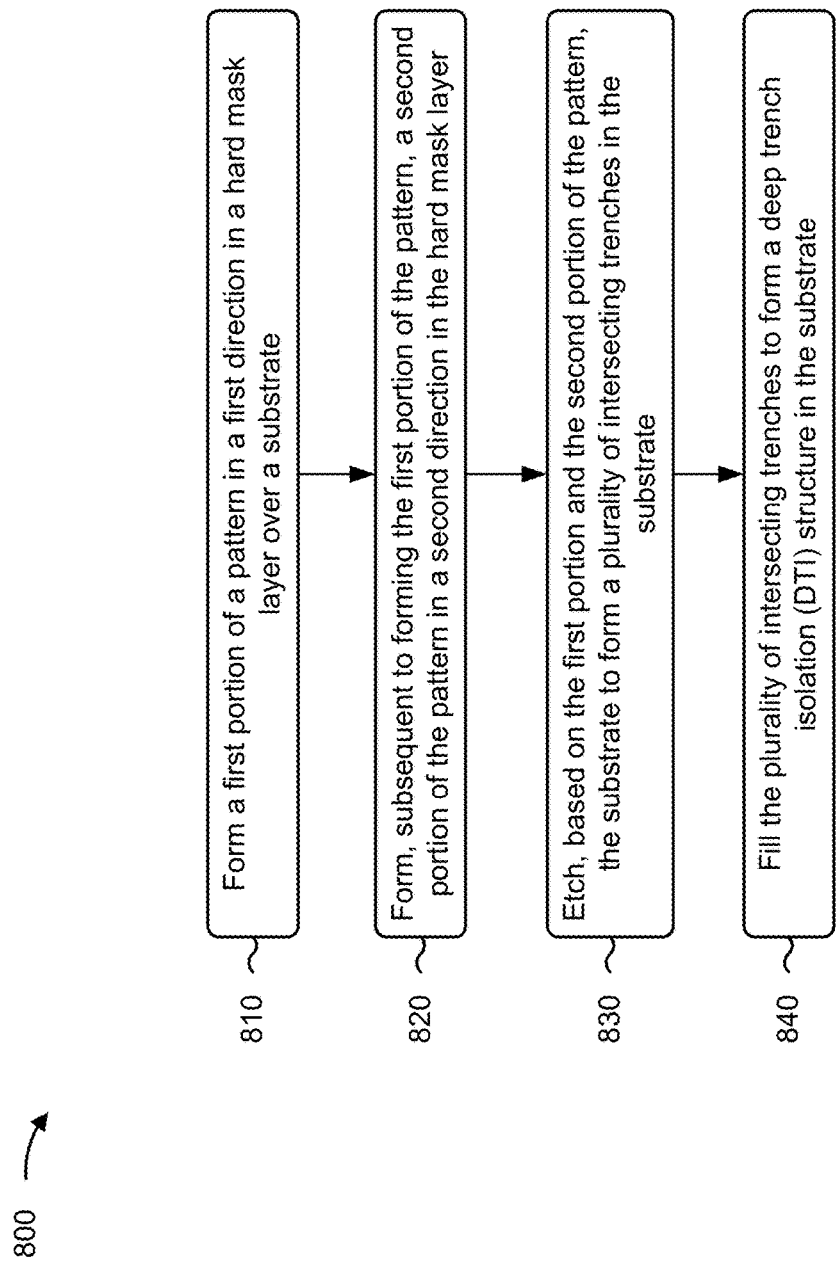

FIG. 8 is a flowchart of an example process 800 associated with forming a DTI structure. In some implementations, one or more process blocks of FIG. 8 may be performed by one or more semiconductor processing tools (e.g., one or more of the semiconductor processing tools 102-114). Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include forming a first portion of a pattern in a first direction in a hard mask layer over a substrate (block 810). For example, one or more of the semiconductor processing tools 102-114 may form a first portion 514 of the pattern 524 in a first direction in the hard mask layer 506 over the substrate 304, as described above.

As further shown in FIG. 8, process 800 may include forming, subsequent to forming the first portion of the pattern, a second portion of the pattern in a second direction in the hard mask layer (block 820). For example, one or more of the semiconductor processing tools 102-114 may form, subsequent to forming the first portion 514 of the pattern 524, a second portion 522 of the pattern 524 in a second direction in the hard mask layer 506, as described above.

As further shown in FIG. 8, process 800 may include etching, based on the first portion and the second portion of the pattern, the substrate to form a plurality of intersecting trenches in the substrate (block 830). For example, one or more of the semiconductor processing tools 102-114 may etch, based on the first portion 514 and the second portion 522 of the pattern 524, the substrate 304 to form the plurality of intersecting trenches 528 in the substrate 304, as described above.

As further shown in FIG. 8, process 800 may include filling the plurality of intersecting trenches to form a DTI structure in the substrate (block 840). For example, one or more of the semiconductor processing tools 102-114 may fill the plurality of intersecting trenches 528 to form a DTI structure (e.g., the DTI structure 204 and/or 308) in the substrate 304, as described above.

Process 800 may include additional implementations, such as any single implementation or any combination of implementations described below and/or in connection with one or more other processes described elsewhere herein.

In a first implementation, the DTI structure is included in a pixel array (e.g., the pixel array 200 and/or 300). In a second implementation, alone or in combination with the first implementation, process 800 includes forming the photodiodes 306 for pixel sensors (e.g., the pixel sensors 202 and/or 302) of the pixel array, where forming the plurality of intersecting trenches includes forming the plurality of intersecting trenches in between the photodiodes. In a third implementation, alone or in combination with one or more of the first and second implementations, a ratio between a depth of the DTI structure and a width of the DTI structure is in a range of approximately 20 to approximately 50. In a fourth implementation, alone or in combination with one or more of the first through third implementations, forming the first portion 514 of the pattern 524 includes forming the first photoresist layer 510 over the hard mask layer 506, forming the first photoresist pattern 512 in the first photoresist layer 510, performing, based on the first photoresist pattern 512, a first etch operation to form the first portion 514 of the pattern 524 in the hard mask layer 506, and removing the first photoresist layer 510.

In a fifth implementation, alone or in combination with one or more of the first through fourth implementations, forming the second portion 522 of the pattern 524 includes forming the second photoresist layer 518 over the hard mask layer 506 after removing the first photoresist layer 510, forming the second photoresist pattern 520 in the second photoresist layer 518, performing, based on the second photoresist pattern 520, a second etch operation to form the second portion 522 of the pattern 524 in the hard mask layer 506, and removing the second photoresist layer 518. In a sixth implementation, alone or in combination with one or more of the first through fifth implementations, process 800 includes etching through the first photoresist layer 510 to the first antireflective coating 508 over the hard mask layer 506, and performing the second etch operation includes etching through the second photoresist layer 518 to the second antireflective coating 516 over the hard mask layer 506.

In a seventh implementation, alone or in combination with one or more of the first through sixth implementations, etching the substrate 304 to form the plurality of intersecting trenches 528 in the substrate 304 includes etching through the ARD layer 502 and into at least a portion of the substrate 304 to form the plurality of intersecting trenches 528 in the substrate 304. In an eighth implementation, alone or in combination with one or more of the first through seventh implementations, process 800 includes removing the hard mask layer 506 and the ARD layer 502 after etching through the ARD layer 502 and into at least the portion of the substrate 304 to form the plurality of intersecting trenches 528, and filling the plurality of intersecting trenches 528 to form the DTI structure 308 in the substrate 304 includes filling the plurality of intersecting trenches 528 to form the DTI structure 308 in the substrate 304 after removing the hard mask layer 506 and the ARD layer 502.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Figure 9:
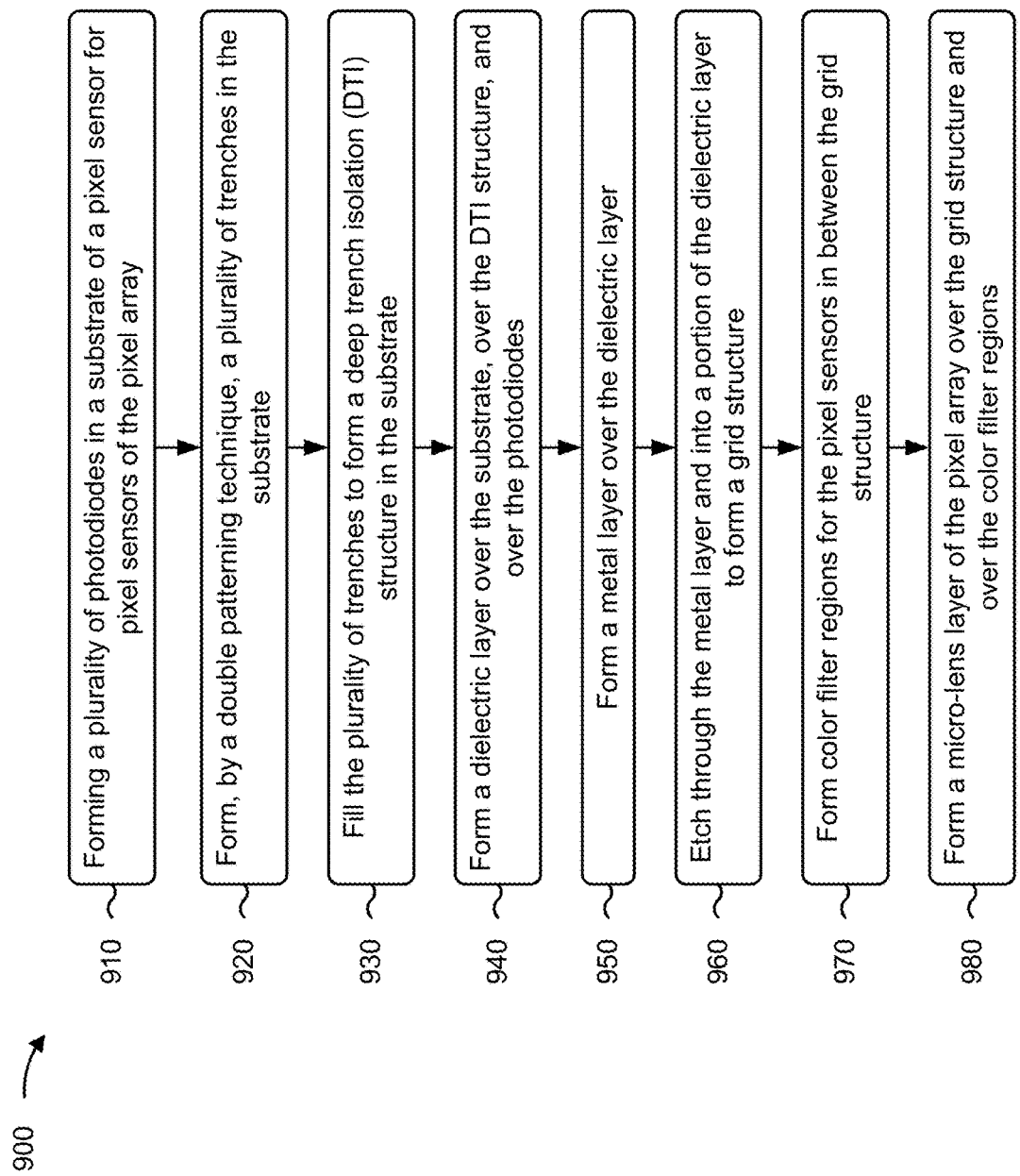

FIG. 9 is a flowchart of an example process 900 associated with forming a DTI structure. In some implementations, one or more process blocks of FIG. 9 may be performed by one or more semiconductor processing tools (e.g., one or more of the semiconductor processing tools 102-114). Additionally, or alternatively, one or more process blocks of FIG. 9 may be performed by one or more components of device 600, such as processor 620, memory 630, storage component 640, input component 650, output component 660, and/or communication component 670.

As shown in FIG. 9, process 900 may include forming photodiodes in the substrate of a pixel array for pixel sensors of the pixel array (block 910). For example, one or more of the semiconductor processing tools 102-114 may form the photodiodes 306 in the substrate 304 of a pixel array (e.g., the pixel array 200 and/or 300) for pixel sensors (e.g., the pixel sensor 202 and/or 302) of the pixel array, as described above.

As shown in FIG. 9, process 900 may include forming a plurality of trenches in the substrate (block 920). For example, one or more of the semiconductor processing tools 102-114 may form a plurality of trenches (e.g., the trenches 408, 418, and/or 528) in the substrate 304, as described above. In some implementations, the plurality of trenches are formed in between the plurality of photodiodes. In some implementations, the plurality of trenches include a first subset of trenches (e.g., the trenches 408 and/or 528a) and a second subset of trenches (e.g., the trenches 418 and/or 528b). In some implementations, the first subset of trenches and the second subset of trenches are approximately perpendicular.

As further shown in FIG. 9, process 900 may include filling the plurality of trenches to form a DTI structure in the substrate (block 930). For example, one or more of the semiconductor processing tools 102-114 may fill the plurality of trenches (e.g., the trenches 408, 418, and/or 528) to form the DTI structure 308 in the substrate 304, as described above.

As further shown in FIG. 9, process 900 may include forming a dielectric layer over the substrate, over the DTI structure, and over the photodiodes (block 940). For example, one or more of the semiconductor processing tools 102-114 may form the dielectric layer 312 over the substrate 304, over the DTI structure 308, and over the photodiodes 306, as described above.

As further shown in FIG. 9, process 900 may include forming a metal layer over the dielectric layer (block 950). For example, one or more of the semiconductor processing tools 102-114 may form the metal layer 314 over the dielectric layer 312, as described above.

As further shown in FIG. 9, process 900 may include etching through the metal layer and into a portion of the dielectric layer to form a grid structure (block 960). For example, one or more of the semiconductor processing tools 102-114 may etch through the metal layer 314 and into a portion of the dielectric layer 312 to form the grid structure 316, as described above.

As further shown in FIG. 9, process 900 may include forming color filter regions for the pixel sensors in between the grid structure (block 970). For example, one or more of the semiconductor processing tools 102-114 may form the color filter regions 318 for the pixel sensors (e.g., the pixel sensors 202 and/or 302) in between the grid structure 316, as described above.

As further shown in FIG. 9, process 900 may include forming a micro-lens layer of the pixel array over the grid structure and over the color filter regions (block 980). For example, one or more of the semiconductor processing tools 102-114 may form the micro-lens layer 320 of the pixel array (e.g., the pixel array 200 and/or 300) over the grid structure 316 and over the color filter regions 318, as described above.

Process 900 may include additional implementations, such as any single implementation or any combination of implementations described below and/or in connection with one or more other processes described elsewhere herein.

In a first implementation, the double patterning technique includes forming the first subset of the plurality of trenches based on a first photoresist pattern (e.g., the first pattern 406), and forming the second subset of the plurality of trenches based on a second photoresist pattern (e.g., the second pattern 416). In a second implementation, alone or in combination with the first implementation, the double patterning technique includes forming the first portion 514 of the hard mask pattern 524 in the hard mask layer 506 based on the first photoresist pattern 512, forming the second portion 522 of the hard mask pattern 524 in the hard mask layer 506 based on the second photoresist pattern 520 and forming the plurality of trenches based on the hard mask pattern 524 in the hard mask layer 506.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, the double patterning techniques described herein may be used to achieve ultra-high-aspect-ratio DTI structures that may be included in a pixel array, a CMOS image sensor, and/or another type of semiconductor device. In particular, reduced corner rounding and reduced etch loading provided by the double patterning techniques described herein may be used to reduce BDTI structure width and may be used to achieve an aspect ratio for a DTI structure (e.g., a ratio between the height or depth of the DTI structure and the width of the DTI structure) in a range of approximately 20 to approximately 50 or greater. The increased aspect ratio of the DTI structure may provide increased full well capacity for pixel sensors isolated by the DTI structure (e.g., the amount of charge that the pixel sensors can hold before saturating) and/or may increase the optical and/or electrical isolation performance of the DTI structure, among other examples.

As described in greater detail above, some implementations described herein provide a method. The method includes forming a first pattern in a first photoresist layer over a substrate. The method includes etching, based on the first pattern, the substrate to form a first set of trenches in a first direction within the substrate. The method includes removing the first photoresist layer after etching the substrate to form the first set of trenches. The method includes forming a second photoresist layer over the substrate after removing the first photoresist layer. The method includes forming a second pattern in the second photoresist layer. The method includes etching, based on the second pattern, the substrate to form a second set of trenches in a second direction within the substrate.

As described in greater detail above, some implementations described herein provide a method. The method includes forming a first portion of a pattern in a first direction in a hard mask layer over a substrate. The method includes forming, subsequent to forming the first portion of the pattern, a second portion of the pattern in a second direction in the hard mask layer. The method includes etching, based on the first portion and the second portion of the pattern, the substrate to form a plurality of intersecting trenches in the substrate. The method includes filling the plurality of intersecting trenches to form a DTI structure in the substrate.

As described in greater detail above, some implementations described herein provide a method. The method includes forming, by a double patterning technique, a plurality of trenches in a substrate of a pixel array, where the plurality of trenches include a first subset of trenches and a second subset of trenches, and where the first subset of trenches and the second subset of trenches are approximately perpendicular. The method includes filling the plurality of trenches to form a DTI structure in the substrate. The method includes forming photodiodes in between the DTI structure in the substrate for pixel sensors of the pixel array. The method includes forming a dielectric layer over the substrate, over the DTI structure, and over the photodiodes. The method includes forming a metal layer over the dielectric layer. The method includes etching through the metal layer and into a portion of the dielectric layer to form a grid structure. The method includes forming color filter regions for the pixel sensors in between the grid structure. The method includes forming a micro-lens layer of the pixel array over the grid structure and over the color filter regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a hard mask layer over an oxide layer, wherein the oxide layer is over a removable dielectric layer that is over a substrate;
    forming a first portion of a pattern in a first direction in the hard mask layer based on removing one or more portions of the hard mask layer up to the oxide layer;
    forming, subsequent to forming the first portion of the pattern, a second portion of the pattern in a second direction in the hard mask layer based on removing one or more other portions of the hard mask layer up to the oxide layer;
    etching, based on the first portion of the pattern and the second portion of the pattern, the oxide layer, the removable dielectric layer, and the substrate to form a plurality of intersecting trenches in the substrate; and
    filling the plurality of intersecting trenches to form a deep trench isolation (DTI) structure in the substrate.

2. The method of claim 1, wherein the DTI structure is included in a pixel array.

3. The method of claim 2, further comprising:
forming photodiodes for pixel sensors of the pixel array;
wherein forming the plurality of intersecting trenches comprises:
forming the plurality of intersecting trenches in between the photodiodes.

4. The method of claim 1, wherein a ratio between a depth of the DTI structure and a width of the DTI structure is in a range of approximately 20 to approximately 50.

5. The method of claim 1, wherein forming the first portion of the pattern comprises:
forming a first photoresist layer over the hard mask layer;
forming a first photoresist pattern in the first photoresist layer;
performing, based on the first photoresist pattern, a first etch operation to form the first portion of the pattern in the hard mask layer; and
removing the first photoresist layer.

6. The method of claim 5, wherein forming the second portion of the pattern comprises:
forming a second photoresist layer over the hard mask layer after removing the first photoresist layer;
forming a second photoresist pattern in the second photoresist layer;
performing, based on the second photoresist pattern, a second etch operation to form the second portion of the pattern in the hard mask layer; and
removing the second photoresist layer.

7. The method of claim 6, wherein performing the first etch operation comprises:
etching through the first photoresist layer to a first anti-reflective coating (ARC) over the hard mask layer; and
wherein performing the second etch operation comprises:
etching through the second photoresist layer to a second ARC over the hard mask layer.

8. The method of claim 1, wherein etching the substrate to form the plurality of intersecting trenches in the substrate comprises:
etching through the removable dielectric layer and into at least a portion of the substrate to form the plurality of intersecting trenches in the substrate.

9. The method of claim 8, further comprising:
removing the hard mask layer and the removable dielectric layer after etching through the removable dielectric layer and into at least the portion of the substrate to form the plurality of intersecting trenches; and
wherein filling the plurality of intersecting trenches to form the DTI structure in the substrate comprises:
filling the plurality of intersecting trenches to form the DTI structure in the substrate after removing the hard mask layer and the removable dielectric layer.

10. A method, comprising:
forming photodiodes for pixel sensors of a pixel array over a substrate;
forming a hard mask layer over an oxide layer, wherein the oxide layer is over a removable dielectric layer that is over the substrate;
forming a first pattern in the hard mask layer based on removing one or more portions of the hard mask layer up to the oxide layer;
forming, subsequent to forming the first pattern, a second pattern in the hard mask layer over the substrate based on removing one or more other portions of the hard mask layer up to the oxide layer;
removing, based on the first pattern and the second pattern, one or more portions of the oxide layer, the removable dielectric layer, and the substrate to form a first set of trenches in a first direction within the substrate and a second set of trenches in a second direction within the substrate; and
forming a deep trench isolation (DTI) structure of the pixel array in the first set of trenches and the second set of trenches.

11. The method of claim 10, wherein the first pattern is formed using a first photoresist layer over the substrate, and wherein the second pattern is formed using a second photoresist layer that is formed over the substrate after removing the first photoresist layer.

12. The method of claim 10, wherein the first set of trenches and the second set of trenches are formed in between the photodiodes.

13. The method of claim 10, wherein forming the first pattern comprises:
forming a first photoresist layer over the hard mask layer;
forming the first pattern in the first photoresist layer;
performing, based on the first pattern, a first etch operation to form the first pattern in the hard mask layer; and
removing the first photoresist layer.

14. The method of claim 13, wherein forming the second pattern comprises:
forming, after forming the first pattern, a second photoresist layer over the hard mask layer;
forming the second pattern in the second photoresist layer;
performing, based on the second pattern, a second etch operation to form the second pattern in the hard mask layer; and
removing the second photoresist layer.

15. A method, comprising:
forming a plurality of photodiodes in a substrate of a pixel array for pixel sensors of the pixel array;
forming a hard mask layer over an oxide layer, wherein the oxide layer is over a removable dielectric layer that is over the substrate;
forming a first portion of a hard mask pattern in the hard mask layer based on a first photoresist pattern and based on removing one or more portions of the hard mask layer up to the oxide layer;
forming a second portion of the hard mask pattern in the hard mask layer based on a second photoresist pattern and based on removing one or more other portions of the hard mask layer up to the oxide layer;
forming a plurality of trenches in the substrate based on the hard mask pattern in the hard mask layer and based on removing portions of the oxide layer, the removable dielectric layer, and the substrate,
wherein trenches of the plurality of trenches are formed in between the plurality of photodiodes;
filling the plurality of trenches to form a deep trench isolation (DTI) structure in the substrate;
forming a dielectric layer over the substrate, over the DTI structure, and over the photodiodes;
forming a metal layer over the dielectric layer;
etching through the metal layer and into a portion of the dielectric layer to form a grid structure;
forming color filter regions for the pixel sensors in between the grid structure; and
forming a micro-lens layer of the pixel array over the grid structure and over the color filter regions.

16. The method of claim 15, wherein the plurality of trenches includes a first subset of trenches and a second subset of trenches, the first subset of trenches corresponding to the first portion of the hard mask pattern and the second subset of trenches corresponding to the second portion of the hard mask pattern.

17. The method of claim 16, wherein the first subset of trenches and the second subset of trenches are approximately perpendicular.

18. The method of claim 16, wherein the first subset of trenches is formed in a first direction and the second subset of trenches is formed in a second direction.

19. The method of claim 16, wherein the first subset of trenches and the second subset of trenches intersect at a plurality of locations in the substrate.

20. The method of claim 15, wherein a ratio between a depth of the plurality of trenches and a width of the plurality of trenches is in a range of approximately 20 to approximately 50.

* * * * *